(12) United States Patent
Jang

(10) Patent No.: US 11,967,604 B2
(45) Date of Patent: Apr. 23, 2024

(54) IMAGE SENSOR AND DISPLAY DEVICE HAVING THE SAME

(71) Applicant: SAMSUNG DISPLAY CO., LTD., Yongin-si (KR)

(72) Inventor: Dae Gwang Jang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 11 days.

(21) Appl. No.: 17/750,687

(22) Filed: May 23, 2022

(65) Prior Publication Data
US 2022/0285421 A1 Sep. 8, 2022

Related U.S. Application Data

(62) Division of application No. 16/799,049, filed on Feb. 24, 2020, now Pat. No. 11,374,052.

(30) Foreign Application Priority Data
Apr. 2, 2019 (KR) ........................ 10-2019-0038706

(51) Int. Cl.
H01L 27/146 (2006.01)
G06V 40/13 (2022.01)
H04N 25/70 (2023.01)

(52) U.S. Cl.
CPC .. *H01L 27/14678* (2013.01); *H01L 27/14609* (2013.01); *H01L 27/14612* (2013.01); *H01L 27/14636* (2013.01); *H04N 25/70* (2023.01); *G06V 40/1318* (2022.01)

(58) Field of Classification Search
CPC ......... H01L 27/14678; H01L 27/14609; H01L 27/1461; H04N 5/357; H04N 5/3745; H04N 5/3786
See application file for complete search history.

(56) References Cited

U.S. PATENT DOCUMENTS

| 5,831,258 | A | 11/1998 | Street |
| 6,246,436 | B1 | 6/2001 | Lin et al. |
| 6,960,788 | B2 | 11/2005 | Joo et al. |
| 7,859,486 | B2 | 12/2010 | Kwon |
| 9,103,724 | B2 | 8/2015 | Aoki et al. |

(Continued)

FOREIGN PATENT DOCUMENTS

| JP | 2008165172 A | 7/2008 |
| JP | 4981116 B2 | 4/2012 |
| JP | 6177362 B2 | 7/2017 |

(Continued)

*Primary Examiner* — David A Zarneke
(74) *Attorney, Agent, or Firm* — CANTOR COLBURN LLP

(57) ABSTRACT

An image sensor includes a sensor pixel. The sensor pixel includes a first transistor coupled between a first power source and a first node, where the first transistor is turned on in response to a first control signal, a light-sensing element coupled between the first node and a second power source, where the light-sensing element generates photocharges in response to incident light, a storage capacitor coupled in parallel to the light-sensing element between the first node and the second power source, and an amplifier including a plurality of transistors coupled in series between the first power source and an output line, where the amplifier outputs a sensing signal corresponding to a voltage of the first node in response to a first driving signal.

9 Claims, 12 Drawing Sheets

(56) References Cited

U.S. PATENT DOCUMENTS

| | | |
|---|---|---|
| 10,154,222 B2 | 12/2018 | Sugawa et al. |
| 2006/0186504 A1 | 8/2006 | Bae et al. |

FOREIGN PATENT DOCUMENTS

| | | |
|---|---|---|
| KR | H11214738 A | 8/1999 |
| KR | 100612564 B1 | 8/2006 |
| KR | 100964586 B1 | 6/2010 |
| KR | 20180014193 A | 2/2018 |
| KR | 1020180098187 A | 9/2018 |
| KR | 101895841 B1 | 10/2018 |

IMAGE SENSOR AND DISPLAY DEVICE HAVING THE SAME

This application is a divisional of U.S. patent application Ser. No. 16/799,049, filed on Feb. 24, 2020, which claims priority to Korean patent application number 10-2019-0038706, filed on Apr. 2, 2019, and all the benefits accruing therefrom under 35 U.S.C. § 119, the content of which in its entirety is herein incorporated by reference.

BACKGROUND

1. Field

Embodiments of the disclosure relate to an image sensor and a display device including the image sensor.

2. Description of the Related Art

Recently, display devices provided in various mobile devices including a smartphone and a tablet personal computer ("PC") have been utilized in various aspects. For example, display devices have been manufactured to support various functions, such as a function of recognizing a user's fingerprint or a surrounding environment or a scanner function. Accordingly, display devices, each including an image sensor, have been widely used.

SUMMARY

Embodiments of the disclosure are directed to an image sensor with reduced noise and a display device including the image sensor.

An embodiment of the disclosure provides an image sensor including a sensor pixel. The sensor pixel includes: a first transistor coupled between a first power source and a first node, where the first transistor is turned on in response to a first control signal; a light-sensing element coupled between the first node and a second power source, where the light-sensing element generates photocharges in response to incident light; a storage capacitor coupled in parallel to the light-sensing element between the first node and the second power source; and an amplifier including a plurality of transistors coupled in series between the first power source and an output line, where the amplifier outputs a sensing signal corresponding to a voltage of the first node in response to a first driving signal.

In an embodiment, the amplifier may include a second transistor coupled between the first power source and the output line, where the second transistor includes a gate electrode coupled to the first node and generates the sensing signal; and a third transistor coupled between the second transistor and the output line, where the third transistor amplifies and outputs the sensing signal during an interval in which the first driving signal is supplied.

In an embodiment, the amplifier may further include a fourth transistor coupled between the third transistor and the output line. The fourth transistor may amplify and output a sensing signal supplied from the third transistor during the interval in which the first driving signal is supplied.

In an embodiment, the image sensor may further include a first driving line coupled in common to gate electrodes of the third and fourth transistors, where the first driving line transmits the first driving signal therethrough; and a first resistor element coupled between the gate electrode of the third transistor and the first driving line.

In an embodiment, the first resistor element may include a transistor element coupled in a form of a diode between the first driving line and the gate electrode of the third transistor.

In an embodiment, the amplifier may include a second resistor element coupled between the first resistor element and the first driving line; and a fifth transistor coupled between the third transistor and the fourth transistor, where the fifth transistor includes a gate electrode coupled between the first and second resistor elements.

In an embodiment, the image sensor may further include a first driving line coupled to the gate electrode of the fourth transistor, where the first driving line transmits the first driving signal therethrough; and a second driving line coupled to the gate electrode of the third transistor, where the second driving line transmits a second driving signal therethrough during the interval in which the first driving signal is supplied.

In an embodiment, the second driving signal may have a gate-on voltage lower than a voltage level of the first driving signal.

In an embodiment, the image sensor may further include a fifth transistor coupled between the third transistor and the fourth transistor, and a third driving line coupled to a gate electrode of the fifth transistor, where the third driving line transmits a third driving signal, which overlaps the first and second driving signals, therethrough.

In an embodiment, the third driving signal may have a gate-on voltage which is higher than a voltage level of the second driving signal and is lower than a voltage level of the first driving signal.

In an embodiment, wherein, during each cycle of a sensing period in which the sensor pixel is activated, the first control signal and the first driving signal may be sequentially supplied to the sensor pixel at an interval of a predetermined time.

In an embodiment, the light-sensing element may be a photodiode.

In an embodiment, the sensor pixel may further include a transfer transistor coupled between the first node and the light-sensing element, where the transfer transistor is turned on in response to a second control signal.

In an embodiment, the first and second control signals may be sequentially supplied to the sensor pixel during each cycle of a sensing period during which the sensor pixel is activated, and the first driving signal may be individually supplied subsequent to the first and second control signals a plurality of times during each cycle.

Another embodiment of the disclosure provides for a display device. The display device includes a display panel including a display pixel; and an image sensor including a sensor pixel. The sensor pixel includes: a first transistor coupled between a first power source and a first node, where the first transistor is turned on in response to a first control signal; a light-sensing element coupled between the first node and a second power source, where the light-sensing element generates photocharges in response to incident light; a storage capacitor coupled in parallel to the light-sensing element between the first node and the second power source; and an amplifier including a plurality of transistors coupled in series between the first power source and an output line, where the amplifier outputs a sensing signal corresponding to a voltage of the first node in response to a first driving signal.

In an embodiment, the amplifier may include a second transistor coupled between the first power source and the output line, where the second transistor includes a gate electrode coupled to the first node to generate the sensing signal; and a third transistor coupled between the second transistor and the output line, where the third transistor amplifies and outputs the sensing signal during an interval in which the first driving signal is supplied.

In an embodiment, the amplifier may further include a fourth transistor coupled between the third transistor and the output line, and the fourth transistor amplifies and outputs a sensing signal supplied from the third transistor during the interval in which the first driving signal is supplied.

In an embodiment, during each cycle of a sensing period in which the sensor pixel is activated, the first control signal and the first driving signal are sequentially supplied to the sensor pixel at an interval of a predetermined time.

In an embodiment, the sensor pixel may further include a transfer transistor coupled between the first node and the light-sensing element, where the transfer transistor is turned on in response to a second control signal.

In an embodiment, the image sensor may be arranged on a rear surface of the display panel, and the sensor pixel may be arranged in a sensing area, which overlaps a portion of a display area in which the display pixel is arranged.

BRIEF DESCRIPTION OF THE DRAWINGS

The above and other features of the invention will become apparent by describing in detail exemplary embodiments thereof with reference to the accompanying drawings, in which.

DETAILED DESCRIPTION

Figure 1:
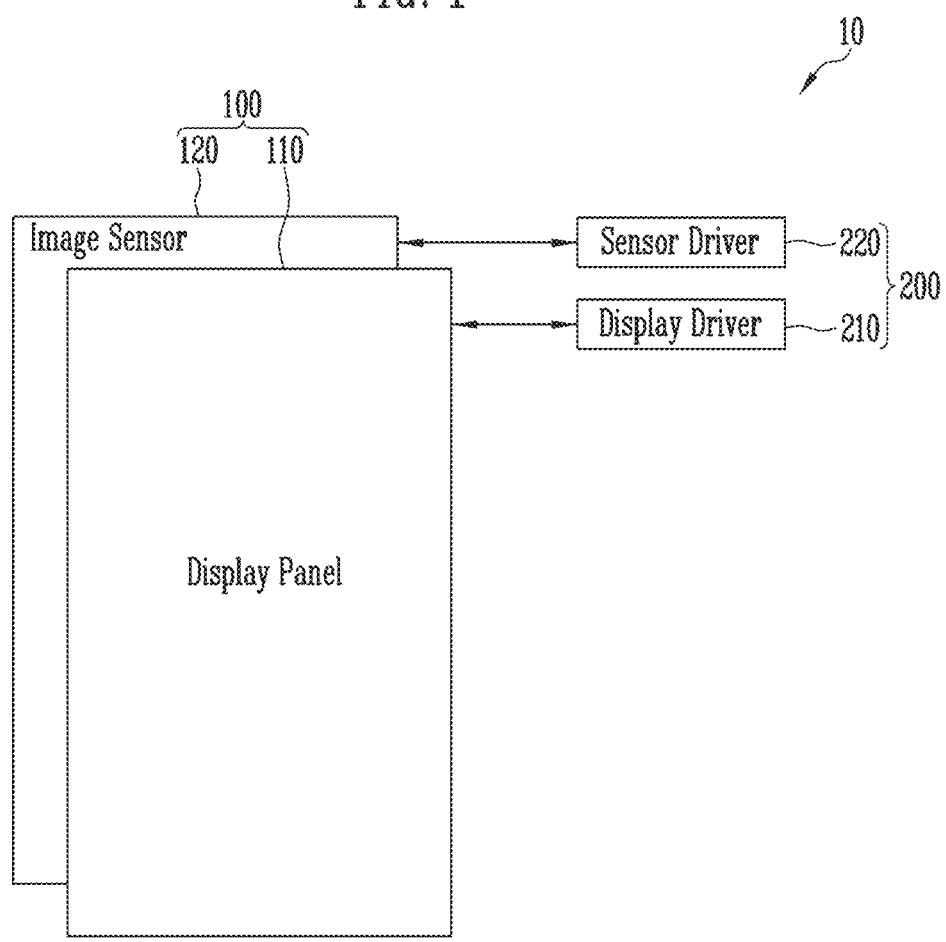
FIG. 1 is a configuration diagram illustrating a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one of A and B" means "A or B." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 is a configuration diagram illustrating a display device 10 according to an embodiment of the disclosure. In accordance with an embodiment, a panel unit 100 and a driver unit 200 of the display device 10 may be separate or independent components as shown in FIG. 1, but not being limited thereto. In an alternative embodiment, a part of a display driver 210 may be integrated with a display panel 110. In an embodiment, an image sensor 120 and a sensor driver 220 may collectively define or constitute a single sensor (e.g., a fingerprint sensor or the like).

Referring to FIG. 1, an embodiment of the display device 10 may include the panel unit 100 and the driver unit 200. In accordance with an embodiment, the panel unit 100 may include the display panel 110 configured to display an image and the image sensor 120 arranged on a surface of the display panel 110. In such an embodiment, the driver unit 200 may include the display driver 210 which drives the display panel 110 and the sensor driver 220 which drives the image sensor 120.

The display panel 110 may include a plurality of display pixels to display an image corresponding to input image data. In an embodiment, the display panel 110 may be, but is not limited to, a light-emitting display panel including organic/inorganic light-emitting elements or a liquid display panel including a liquid crystal layer. In embodiments of the invention, the type and/or structure of the display panel 110 is not particularly limited and may be changed in various forms.

The image sensor 120 may include a plurality of sensor pixels for generating sensing signals corresponding to incident light. In an embodiment, the image sensor 120 may be arranged on a rear surface of the display panel 110. In such an embodiment, various functions, such as a function of recognizing a user's fingerprint or a surrounding environment or a scanner function, may be realized using the image sensor 120 while the degradation of image quality caused by the image sensor 120 is effectively prevented.

The display driver 210 may include driver circuits which supply various types of driving signals to the display panel 110. In one embodiment, for example, the display driver 210 may include a scan driver and a data driver which supply scan signals and data signals, respectively, to display pixels.

The sensor driver 220 may include various types of driving/sensing circuits for driving the image sensor 120 and acquiring sensed information based on sensing signals output from the image sensor 120. In one embodiment, for example, the sensor driver 220 may include a transmission ("Tx") circuit unit which supplies various types of driving signals and/or control signals to sensor pixels, and a reception ("Rx") circuit unit which receives sensing signals output from the sensor pixels in response to the driving signals, analyzes the sensing signals, and generates sensed information. In an embodiment, the Tx circuit unit may have a plurality of Tx channels corresponding to driving lines of the image sensor 120 (e.g., driving lines arranged in respective horizontal rows of the image sensor 120). In such an embodiment, the Rx circuit unit may include a plurality of Rx channels corresponding to output lines of the image sensor 120 (e.g., output lines arranged in respective vertical columns of the image sensor 120).

Figure 2:
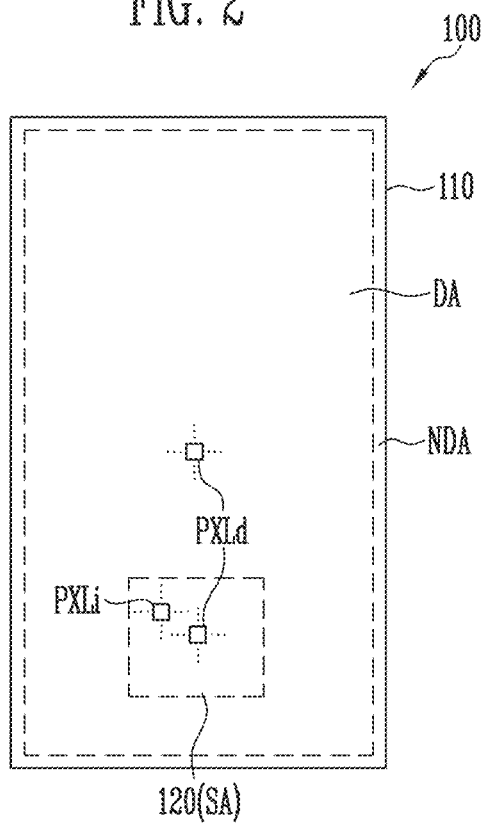
FIGS. 2 and 3 are plan views illustrating the panel unit of a display device according to an embodiment of the disclosure.
Figure 3:
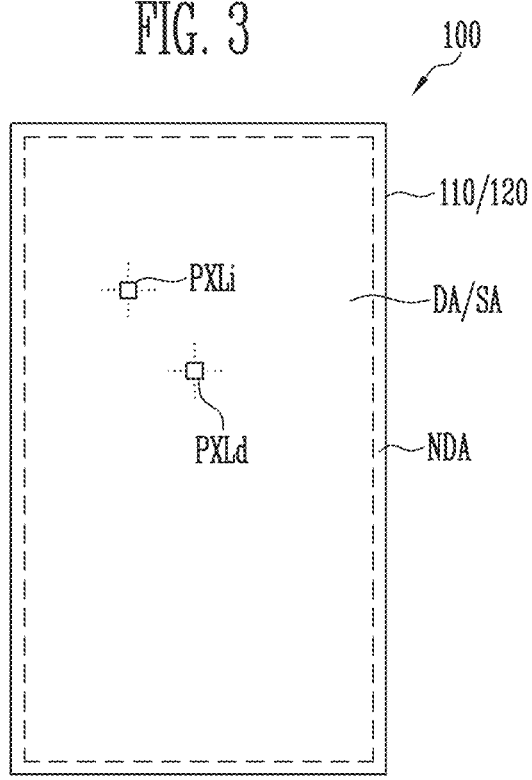

FIGS. 2 and 3 are plan views illustrating the panel unit 100 of the display device 10 according to an embodiment of the disclosure. Particularly, FIGS. 2 and 3 illustrate embodiments of the display panel 110 and the image sensor 120 having different array structures from each other.

Referring to FIGS. 2 and 3, an embodiment of the display panel 110 may include display pixels PXLd arranged in a display area DA. The image sensor 120 may include sensor pixels PXLi arranged in a sensing area SA and may be arranged to overlap at least a portion of the display panel 110. In one embodiment, for example, the image sensor 120 may be arranged on a rear surface of the display panel 110 in a way such that the sensing area SA overlaps at least a portion of the display area DA.

In an embodiment, the image sensor 120 may be arranged to overlap a portion of the display panel 110, and the image sensor 120 may have a size (e.g., an area) smaller than that of the display panel 110, as illustrated in FIG. 2. In an embodiment, the sensing area SA may overlap a portion of the display area DA.

In an alternative embodiment, the image sensor 120 may be arranged to overlap the display panel 110, and the image sensor 120 may have a size (e.g., an area) substantially identical to or similar to that of the display panel 110, as illustrated in FIG. 3. In such an embodiment, the sensing area SA may be arranged to substantially entirely overlap the display area DA.

However, the disclosure is not limited thereto. In such an embodiment, the sizes and/or array structure of the display panel 110 and the image sensor 120 may be variously modified.

The display panel 110 may include the display area DA and a non-display area NDA. The display area DA may be defined on a screen of the display device 10. The non-display area NDA may be arranged around the display area DA, and may be disposed, for example, in a peripheral region of the display panel 110 to surround the display area DA.

The display area DA may be an area in which a plurality of display pixels PXLd is arranged and may also be referred to as an active area of the display device 10. In an embodiment, the display pixels PXLd may be pixels having various types and/or structures. In one embodiment, for example, the display pixels PXLd may be pixels of a light-emitting display panel, each having an light-emitting element. The display device 10 displays an image in the display area DA by driving the display pixels PXLd based on input image data.

The non-display area NDA may be an area disposed around the display area DA and may also be referred to as the non-active area of the display device 10. Herein, the non-display area NDA may inclusively mean an area of the display panel 110 other than the display area DA. In an embodiment, the non-display area NDA may include a wiring area, a pad area and/or various types of dummy areas.

The image sensor 120 may include the sensing area SA in which sensor pixels PXLi are arranged in a way such that the shape of a target (e.g., a specific pattern or the like of the target), such as a user's fingerprint, and/or the brightness of the target may be effectively sensed. In accordance with an embodiment, the sensing area SA may be set to an area overlapping only a portion of the display area DA, as illustrated in FIG. 2, or to an area overlapping the entire display area DA, as illustrated in FIG. 3. Alternatively, the display area DA and the sensing area SA may be arranged in a way such that only partial regions thereof overlap each other. In an embodiment, each of the sensor pixels PXLi may include a light-sensing element (or also referred to as a "light-receiving element") to generate a sensing signal corresponding to incident light.

In an embodiment, as a light source of the image sensor 120, a light source arranged in the display panel 110 may be used. In one embodiment, for example, a light-emitting element provided in a display pixel PXLd may be used as a light source for fingerprint sensing or the like. In one embodiment, for example, during a predetermined sensing period in which a fingerprint sensing mode or the like is activated, at least some of the display pixels PXLd overlapping the sensing area SA emit light, and the image sensor 120 may operate using internal light of the display panel 110 from the display pixels PXLd. In such an embodiment, the display pixels PXLd are used as the light sources of the image sensor 120 without using a separate external light source, such that the thickness of the display device 10 may be reduced or minimized, and manufacturing costs may be decreased.

However, the disclosure is not limited thereto. In an alternative embodiment, in addition to the light-emitting elements of the display pixels PXLd used for image display, a separate light source may be disposed inside/outside the display panel 110 and may be used as the light source of the image sensor 120.

FIGS. 4A to 4D are plan views illustrating an array structure of display pixels PXLd and sensor pixels PXLi according to an embodiment of the disclosure. Particularly, FIGS. 4A to 4D illustrate relative sizes, resolution and/or array relations of display pixels PXLd and sensor pixels PXLi arranged in the sensing area SA of FIGS. 2 and 3 and the display area DA overlapping the sensing area SA. However, the disclosure is not limited to the embodiments illustrated in FIGS. 4A to 4D, and the shapes, array forms, relative sizes, numbers, resolution, and/or mutual array relations of the display pixels PXLd and/or the sensor pixels PXLi may be variously modified.

In the above description of the embodiments in FIGS. 2 and 3, the sensing area SA and the display area DA have been described as independent or separate elements to describe an area in which the sensor pixels PXLi are arranged in the image sensor 120 and an area in which the display pixels PXLd are arranged in the display panel 110. FIGS. 4A to 4D illustrate an array structure of display pixels PXLd and sensor pixels PXLi in an area in which the sensing area SA and the display area DA overlap each other, and a portion of the display device 10 in which the display pixels PXLd and the sensor pixels PXLi are arranged together will be inclusively referred to as a "sensing area SA".

Figure 4A:
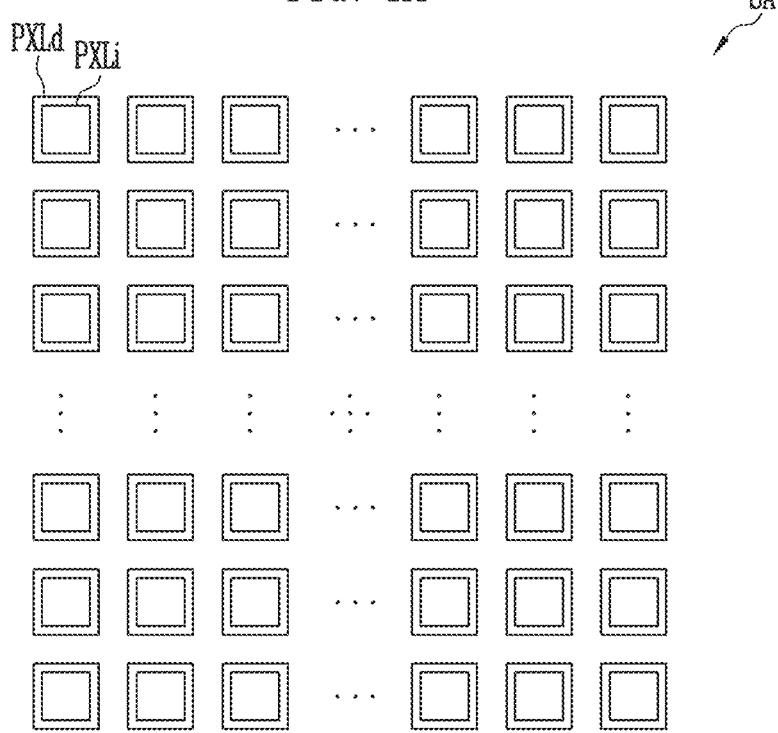
FIGS. 4A to 4D are plan views illustrating an array structure of display pixels and sensor pixels according to an embodiment of the disclosure.

In an embodiment, referring to FIG. 4A, sensor pixels PXLi may be arranged with a same resolution (or a same density) as display pixels PXLd in the sensing area SA. In one embodiment, for example, in the sensing area SA, a number of sensor pixels PXLi arranged therein may be identical to the number of display pixels PXLd arranged therein, and the sensor pixels PXLi may be arranged to form pairs with the display pixels PXLd in a one-to-one correspondence.

In an embodiment, the display pixels PXLd and the sensor pixels PXLi may overlap each other while forming pairs in a one-to-one correspondence, as illustrated in FIG. 4A. In such an embodiment, at least a portion of each of the sensor pixels PXLi may overlap any one display pixel PXLd. In one embodiment, for example, each sensor pixel PXLi may be arranged in a pixel area in which one display pixel PXLd is formed, and the sensor pixel PXLi may have a size smaller than that of the corresponding display pixel PXLd. Here, the term "pixel area" may inclusively mean an area in which at least one light-emitting element and/or a pixel circuit which constitute each display pixel PXLd are disposed.

However, in such an embodiment, the array structure of display pixels PXLd and sensor pixels PXLi may be variously modified or changed in various forms. In an alternative embodiment, the display pixels PXLd and the sensor pixels PXLi are arranged adjacent to each other while forming respective pairs in a one-to-one correspondence, but the display pixels PXLd and the sensor pixels PXLi may be alternately arranged in a way such that the display pixels PXLd and the sensor pixels PXLi do not overlap each other. Alternatively, the display pixels PXLd and the sensor pixels PXLi may be alternately arranged not to overlap each other regardless of the relative sizes and/or the numbers of display pixels PXLd and sensor pixels PXLi.

Figure 4B:
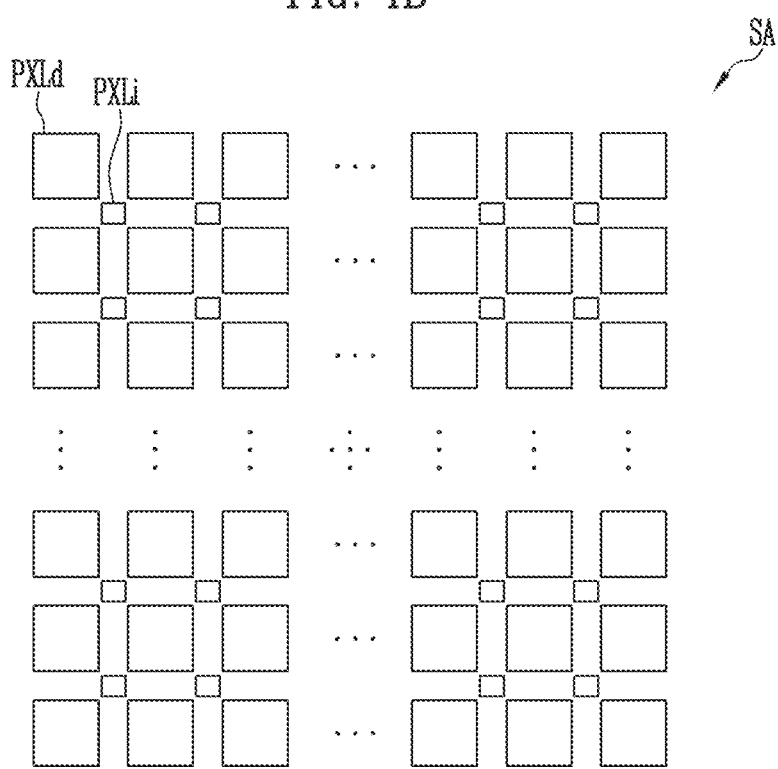

Referring to FIG. 4B, in an embodiment, sensor pixels PXLi may be arranged between display pixels PXLd not to overlap the display pixels PXLd. In an embodiment, sensor pixels PXLi may arranged in the sensing area SA to have resolution (or density) identical to or different from that of display pixels PXLd. In an embodiment, the sensor pixels PXLi may have a size identical to or different from that of the display pixels PXLd. Alternatively, the sensor pixels PXLi may be arranged in the sensing area SA to have a predetermined size and/or predetermined resolution regardless of the size and/or the resolution of the display pixels PXLd.

Figure 4C:
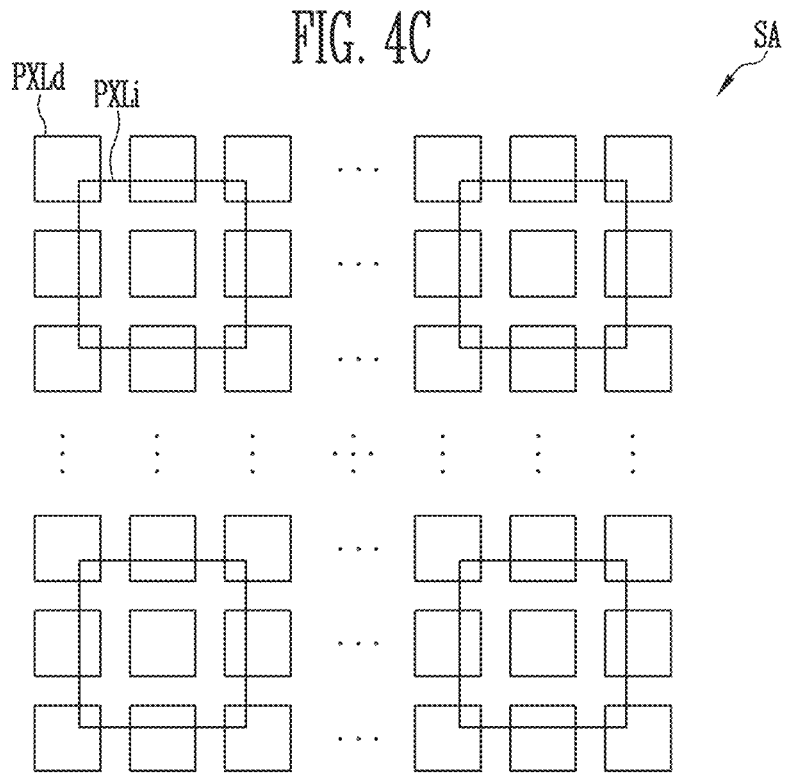

Referring to FIG. 4C, the sensing area SA may include sensor pixels PXLi, the number of which is less than the number of the display pixels PXLd. In such an embodiment, the sensor pixels PXLi may be distributed over the sensing area SA at resolution lower than that of the display pixels PXLd. In one embodiment, for example, each sensor pixel PXLi may be arranged in the sensing area SA to have such a size and/or at interval determined in a way such that each sensor pixel PXLi is allowed to overlap a plurality of display pixels PXLd arranged in the sensing area SA.

In such an embodiment, the sensor pixels PXLi may be distributed over the sensing area SA at resolution lower than that of the display pixels PXLd, and a distribution form thereof may be changed or variously modified. In an alternative embodiment, the sensor pixels PXLi may be arranged to overlap only some of the display pixels PXLd arranged in the sensing area SA. Alternately, in the sensor pixels PXLi may be arranged not to overlap the display pixels PXLd while being distributed over the sensing area SA at resolution lower than that of the display pixels PXLd.

Figure 4D:
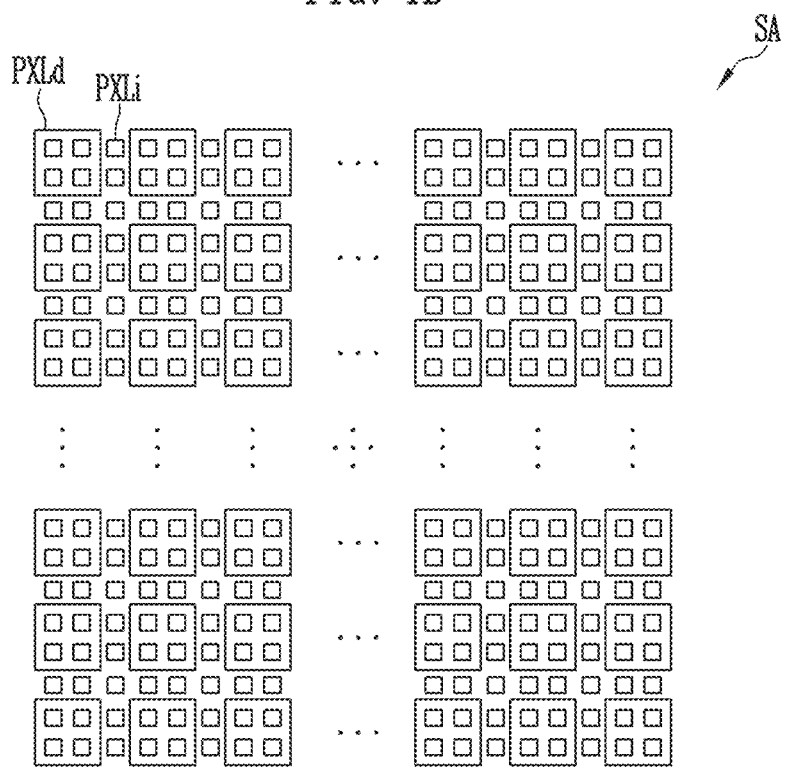

Referring to FIG. 4D, the sensing area SA may include sensor pixels PXLi, the number of which is greater than the number of the display pixels PXLd. In such an embodiment, the sensor pixels PXLi may be distributed over the sensing area SA at resolution higher than that of the display pixels PXLd. In one embodiment, for example, some of sensor pixels PXLi arranged in the sensing area SA may overlap display pixels PXLd, and some other sensor pixels PXLi may be arranged between display pixels PXLd.

In an embodiment, where sensor pixels PXLi may be distributed over the sensing area SA at resolution higher than that of display pixels PXLd, the sensor pixels PXLi may be arranged not to overlap the display pixels PXLd. In one embodiment, for example, sensor pixels PXLi may be densely arranged only in regions between display pixels PXLd while having a size smaller than that of the display pixels PXLd.

In an embodiment, as shown in FIG. 4D, sensor pixels PXLi may be regularly arranged in the sensing area SA, but the disclosure is not limited thereto. In an alternative embodiment, sensor pixels PXLi may be irregularly distributed over the sensing area SA. In such an embodiment, the sizes, resolution and/or distribution forms of sensor pixels PXLi may be variously modified or changed in various manners.

Figure 5A:
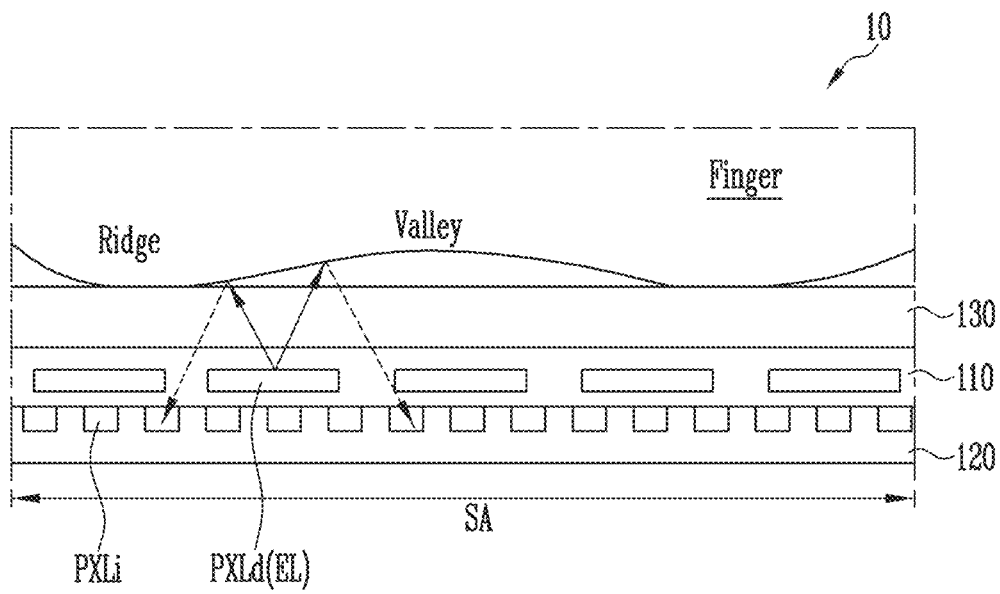
FIGS. 5A and 5B are sectional views illustrating a display device according to an embodiment of the disclosure.
Figure 5B:
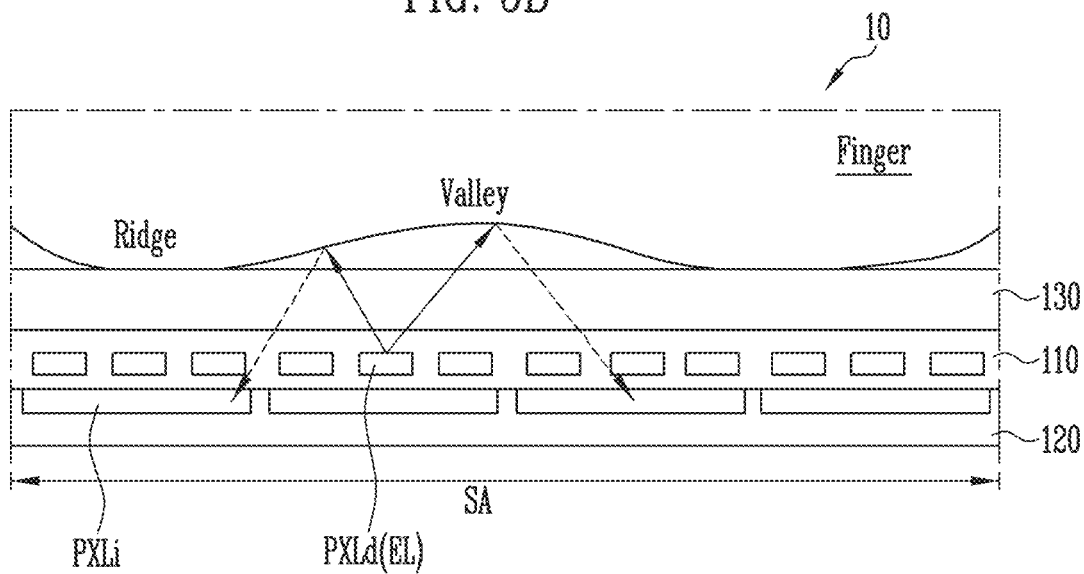

FIGS. 5A and 5B are sectional views illustrating the display device 10 according to an embodiment of the disclosure. Particularly, FIGS. 5A and 5B schematically illustrate a fingerprint sensing method using the display device 10 together with a schematic section of the sensing area SA of the display device 10.

Referring to FIGS. 5A and 5B, an embodiment of the display device 10 may include a display panel 110 including display pixels PXLd, and an image sensor 120 and a window 130 respectively arranged on opposite surfaces of the display panel 110. In an embodiment, the image sensor 120 and the window 130 may be respectively arranged on a rear surface and a front surface of the display panel 110. In an embodiment, the window 130 may be selectively provided in the display device 10. In an alternative embodiment, the window 130 may be omitted or may be integrated with the display panel 110.

In an embodiment, the display panel 110 and the image sensor 120 may overlap each other at least in a sensing area SA. In accordance with an embodiment, sensor pixels PXLi may be distributed over the sensing area SA at a resolution higher than that of display pixels PXLd, as illustrated in FIG. 5A, or may be distributed over the sensing area SA at resolution lower than that of the display pixels PXLd, as illustrated in FIG. 5B. In an embodiment, the sensor pixels PXLi may be distributed over the sensing area SA, with at least a resolution sufficient to perform a sensing function. In one embodiment, for example, when the image sensor 120 is designed to sense a fingerprint, the sensor pixels PXLi may be distributed over the sensing area SA, with at least a resolution (or density) sufficient to identify a fingerprint.

In an embodiment, the display device 10 may sense a fingerprint or the like using at least some of the display pixels PXLd as light sources. In one embodiment, for example, during a sensing period in which the image sensor 120 is activated, the display device 10 may generate internal light of the display panel 110 by driving at least some of the display pixels PXLd distributed over the sensing area SA. In one embodiment, for example, the display device 10 may emit light by driving at least some of display pixels PXLD in the sensing area SA and by causing light-emitting elements EL in the driven display pixels to emit light.

In such an embodiment, when a user's finger touches or approaches the top surface of the display device 10, for example, the window 130 of the sensing area SA, at least part of light emitted from the display panel 110 may be reflected from the user's finger, and then may be incident on the sensor pixels PXLi after sequentially passing through the window 130 and the display panel 110. Then, the sensor pixels PXLi may output sensing signals corresponding to incident light. The sensing signals output from the sensor pixels PXLi may be input to the sensor driver 220, and the sensor driver 220 may generate fingerprint information of the user by aggregating respective output signals of the sensor pixels PXLi. In one embodiment, for example, reflected light components that have been reflected from respective ridges and valleys of the fingerprint and are incident on the sensor pixels PXLi may have different quantities of light or different waveforms. Therefore, the form (pattern) of the fingerprint may be detected by aggregating the sensing signals received from the sensor pixels PXLi and by identifying the ridges and valleys of the fingerprint. In such an embodiment, various types of information as well as the user's fingerprint may be obtained through a light-sensing (photodetection) scheme using the image sensor 120.

In an embodiment, as shown in FIGS. 5A and 5B, a fingerprint or the like may be sensed using the internal light of the display panel 110 emitted from at least some display pixels PXLd, but the disclosure is not limited thereto. In an alternative embodiment, a separate light source may be arranged inside and/or outside the display device 10 and is driven during a sensing period in which the image sensor 120 is activated, thus enabling a fingerprint or the like to be sensed.

Figure 6:
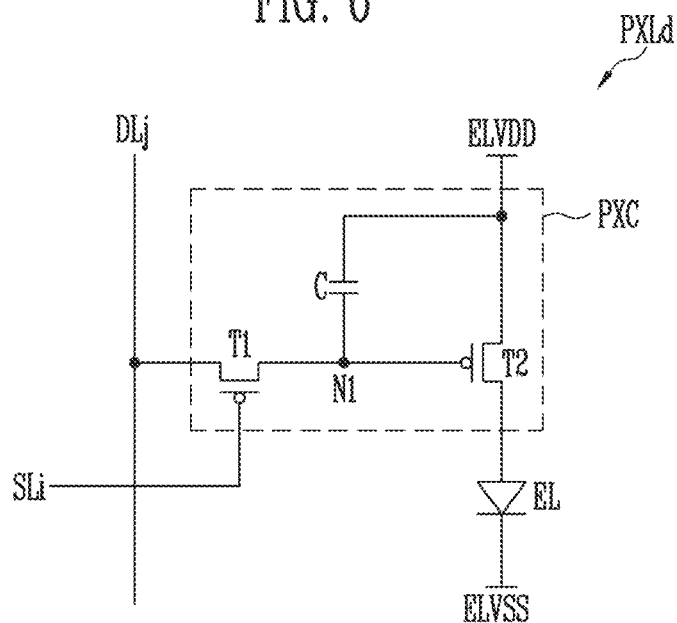
FIG. 6 is a circuit diagram illustrating a display device according to an embodiment of the disclosure.

FIG. 6 is a circuit diagram illustrating a display pixel PXLd according to an embodiment of the disclosure. Particularly, FIG. 6 shows a display pixel PXLd arranged in the display area DA of FIGS. 2 and 3. In FIG. 6, a display pixel PXLd arranged in an i-th row (where i is a natural number) and a j-th column (where j is a natural number) of the display area DA is illustrated. In an embodiment, display pixels PXLd arranged in the display area DA of FIGS. 2 and 3 may have substantially a same structure as that shown in FIG. 6. In one embodiment, for example, the display pixels PXLd may be formed or disposed in the display area DA in a repeating pattern while having substantially the same structure in a backplane layer in which respective pixel circuits PXC are arranged and in a light-emitting element layer in which respective light-emitting elements EL are arranged. However, the disclosure is not limited thereto. In an alternative embodiment, at least one display pixel PXLd may have a structure different from that of the remaining display pixels PXLd.

Referring to FIG. 6, an embodiment of the display pixel PXLd may include a light-emitting element EL coupled (e.g., electrically connected) between a first pixel power source ELVDD and a second pixel power source ELVSS, and a pixel circuit PXC coupled between the first pixel power source ELVDD and the light-emitting element EL and further coupled to a corresponding scan line SLi and a corresponding data line DLj and configured to control a driving current flowing through the light-emitting element EL. However, the location of the pixel circuit PXC is not limited thereto. In one embodiment, for example, the pixel circuit PXC may also be coupled between the light-emitting element EL and the second pixel power source ELVSS. In an embodiment, where the display pixel PXLd is a passive pixel, the pixel circuit PXC may be omitted. In such an embodiment, both ends (e.g., an anode electrode and a cathode electrode) of the light-emitting element EL may be directly coupled to a predetermined power line (e.g., a first or second power line) and a predetermined signal line (e.g., a scan line SLi or a data line DLj).

The first pixel power source ELVDD and the second pixel power source ELVSS may have different potentials or voltages from each other. In one embodiment, for example, the first pixel power source ELVDD may be set to high-potential power, and the second pixel power source ELVSS may be set to low-potential power. A potential difference between the first pixel power source ELVDD and the second pixel power source ELVSS, that is, a voltage applied therebetween, may be greater than the threshold voltage of the light-emitting element EL.

The light-emitting element EL may be coupled to the first pixel power source ELVDD via the pixel circuit PXC. In one embodiment, for example, an anode electrode of the light-emitting element EL may be coupled to the first pixel power source ELVDD via a second transistor T2. In such an embodiment, a cathode electrode of the light-emitting element EL may be coupled to the second pixel power source ELVSS. In such an embodiment, the light-emitting element EL emits light with luminance corresponding to the driving current supplied from the pixel circuit PXC. In an embodiment, the light-emitting element EL may be, but is not limited to, an organic light-emitting diode ("OLED") including an organic light-emitting layer. In an alternative embodiment, micro-sized inorganic light-emitting elements, the sizes of which are nanoscale or microscale levels, may constitute the light source of the display pixel PXLd.

The pixel circuit PXC may include first and second transistors T1 and T2 and a capacitor C. The first transistor (hereinafter also referred to as "switching transistor") T1 may be coupled between the data line DLj and a first node N1. In such an embodiment, a gate electrode of the first transistor T1 may be coupled to a scan line SLi. The first transistor T1 may be turned on when a scan signal having a gate-on voltage (e.g., a low voltage) is supplied through the scan line SLi, thus electrically coupling the data line DLj to the first node N1. In such an embodiment, when the first transistor T1 is turned on, a data signal supplied through the data line DLj may be transferred to the first node N1.

The second transistor (hereinafter also referred to as "driving transistor") T2 may be coupled between the first pixel power source ELVDD and the light-emitting element EL. In such an embodiment, a gate electrode of the second transistor T2 may be coupled to the first node N1. The second transistor T2 controls the driving current flowing into the light-emitting element EL in response to the voltage of the first node N1. In one embodiment, for example, the second transistor T2 may control the supply/non-supply of the driving current and/or the magnitude of the driving current in response to the voltage of the first node N1.

The capacitor C may be coupled between the first pixel power source ELVDD and the first node N1. In such an embodiment, the capacitor C stores a voltage corresponding to a data signal supplied to the first node N1 during each frame period.

In embodiments of the invention, the type and structure of the display pixel PXLd are not limited to those illustrated in FIG. 6. In an embodiment, the display pixel PXLd may be configured as any of pixels that conform to currently known various types, structures and/or driving schemes. Further, in FIG. 6, although an embodiment of the display pixel PXLd where the display device 10 is a light-emitting display device (e.g., an organic light-emitting display device), is illustrated, the disclosure is not limited thereto. In an embodiment, the structure, the driving scheme, etc. of the display pixel PXLd may be variously modified or changed in various manners depending on the type, structure and/or driving scheme of the display device 10.

Figure 7:
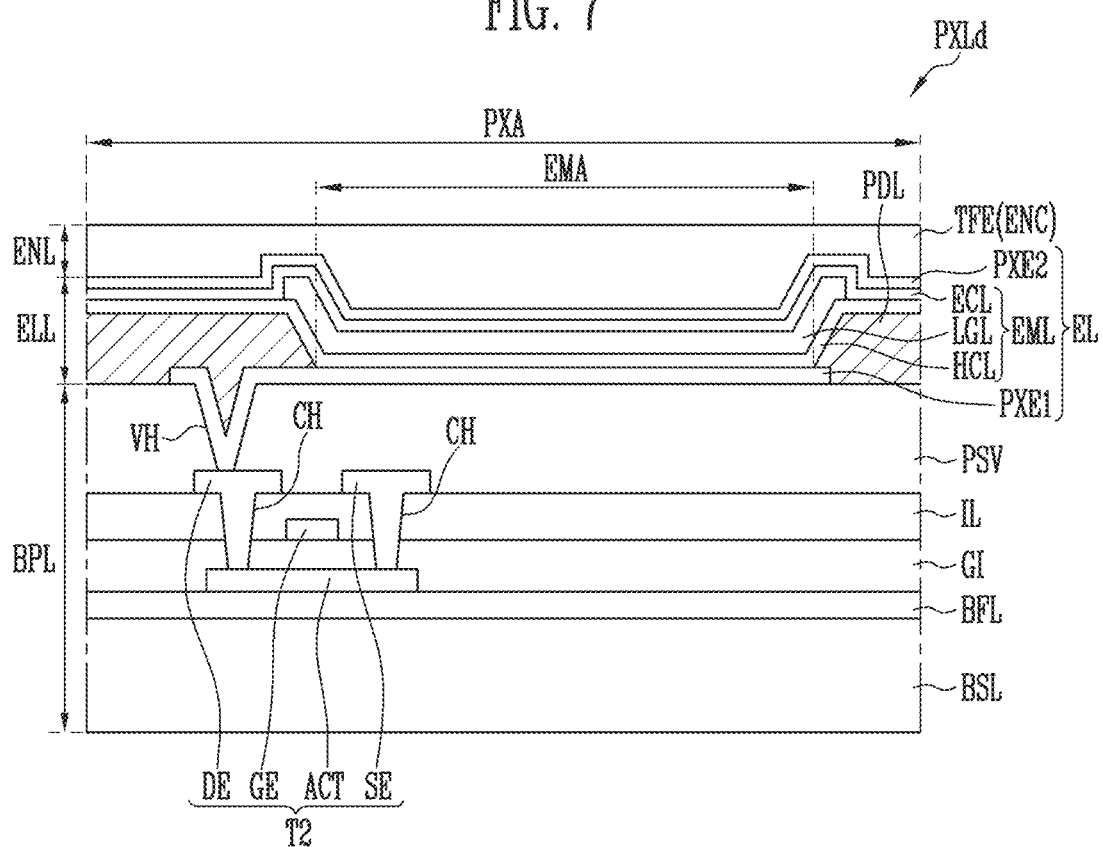
FIG. 7 is a sectional view illustrating a display pixel according to an embodiment of the disclosure.

FIG. 7 is a sectional view illustrating a display pixel PXLd according to an embodiment of the disclosure. Particularly, FIG. 7 illustrates a section of an embodiment of the display pixel PXLd illustrated in FIG. 6. For convenience of description, only a portion of the display pixel PXLd (e.g., a region in which the light-emitting element EL and the second transistor T2 coupled thereto are arranged) is illustrated in FIG. 7. In an embodiment, the first transistor T1 of the display pixel PXLd may have a sectional structure substantially identical or similar to that of the second transistor T2, but the transistor structure of the disclosure is not limited thereto. In an embodiment, at least one of electrodes forming the capacitor C may be arranged in a same layer as at least one of the electrodes constituting the first and second transistors T1 and T2, but the disclosure is not limited thereto.

Referring to FIGS. 6 and 7, each display pixel PXLd may be disposed on a surface of a base layer BSL that is the basic material of the display panel 110. In one embodiment, for example, each display pixel PXLd may be disposed in the corresponding pixel area PXA on the base layer BSL.

The base layer BSL may be a rigid or flexible substrate, and the property or material thereof is not particularly limited. In one embodiment, for example, the base layer BSL may be manufactured as a rigid substrate including or formed of a glass or a tempered glass, a thin-film substrate having flexibility, or an insulating layer having a single-layer structure or a multi-layer structure.

In an embodiment, a buffer layer BFL may be disposed on a surface of the base layer BSL. The buffer layer BFL may effectively prevent impurities from being diffused from the base layer BSL and may improve the flatness of the base layer BSL. The buffer layer BFL may have a single-layer structure or a multi-layer structure including two or more layers. In an embodiment, the buffer layer BFL may be an inorganic insulating layer including or formed of an inorganic material. In one embodiment, for example, the buffer layer BFL may include or be formed of silicon nitride, silicon oxide or silicon oxynitride, for example. In an embodiment, where the buffer layer BFL has a multi-layer structure, individual layers of the buffer layer BFL may include or be formed of a same material as each other or different materials from each other. Alternatively, the buffer layer BFL may be omitted.

In an embodiment, various types of circuit elements constituting the pixel circuit PXC, together with the second transistor T2, may be disposed on the buffer layer BFL. In an embodiment, during a process for forming the circuit elements, wires (or lines) including various power lines and/or signal lines may be formed together with the circuit elements. In one embodiment, for example, at processing steps at which the circuit elements of the pixel circuit PXC are formed, first and second power lines for supplying power from the first pixel power source ELVDD and the second pixel power source ELVSS and the scan line SLi and the data line DLj for transferring a scan signal and a data signal to the corresponding display pixel PXLd may be formed together.

The second transistor T2 may include an active layer ACT, a gate electrode GE, a source electrode SE, and a drain electrode DE. In an embodiment, the active layer ACT may be disposed on the buffer layer BFL and may include or be made of a semiconductor material. In one embodiment, for example, the active layer ACT may be a semiconductor pattern including polysilicon, amorphous silicon, an oxide semiconductor, or the like, and may be a semiconductor layer doped or undoped with impurities. Alternatively, only a region of the active layer ACT may be selectively doped with impurities.

A gate insulating layer GI may be disposed on the active layer ACT, and the gate electrode GE may be disposed on the gate insulating layer GI. In an embodiment, the scan line SLi may be formed together with the gate electrode GE during a same process.

An interlayer insulating layer IL may be disposed on the gate electrode GE, and the source electrode SE and the drain electrode DE may be disposed on the interlayer insulating layer IL. The source electrode SE and the drain electrode DE may be coupled to different regions of the active layer ACT by respective contact holes CH defined through the gate insulating layer GI and the interlayer insulating layer IL.

In an embodiment, as shown in FIG. 7, the source electrode SE and the drain electrode DE are disposed in a layer different from a layer in which the active layer ACT is disposed, but the disclosure is not limited thereto. In an alternative embodiment, the source electrode SE and/or the drain electrode DE may extend from both ends of the active layer ACT and may be integrated with the active layer ACT.

A passivation layer PSV (hereinafter also referred to as a "planarization layer") may be disposed on the source electrode SE and the drain electrode DE. The passivation layer PSV may substantially planarize the top surface of the pixel circuit PXC while covering the entire surface of the pixel circuit PXC including the second transistor T2.

In accordance with an embodiment, the base layer BSL, the circuit elements (e.g., circuit elements constituting each pixel circuit PXC including the second transistor T2) disposed on a surface of the base layer BSL and various types of power lines and/or wires formed together with the circuit elements may define the backplane layer BPL of the display device 10. In one embodiment, for example, the backplane layer BPL may include the base layer BSL and a circuit element layer (e.g., a circuit element layer in which the pixel circuit PXC and/or various types of lines are disposed) disposed on a surface of the base layer BSL.

The light-emitting element EL may be disposed on the passivation layer PSV. Each light-emitting element EL may include a first pixel electrode PXE1, a light-emitting layer EML, and a second pixel electrode PXE2 which are sequentially disposed in a light-emitting area EMA of the corresponding display pixel PXLd.

The first pixel electrode PXE1 may be disposed on the passivation layer PSV and may be coupled to one electrode of the second transistor T2, for example, the drain electrode DE, through a via hole VH defined through the passivation layer PSV. In an embodiment, the first pixel electrode PXE1 may be, but is not limited to, an anode electrode of the light-emitting element EL.

A pixel-defining layer PDL which defines each pixel area PXA (especially the light-emitting area EMA) may be disposed on a surface of the base layer BSL on which the first pixel electrode PXE1 or the like is disposed. The pixel-defining layer PDL may be disposed between the light-emitting areas EMA of respective display pixels PXLd and an opening for exposing the first pixel electrode PXE1 from the corresponding light-emitting area EMA is defined in the pixel-defining layer PDL. In one embodiment, for example, the pixel-defining layer PDL may upwardly protrude from the surface of the base layer BSL, on which the first pixel electrode PXE1 or the like is disposed, along the periphery of each light-emitting area EMA.

The light-emitting layer EML may be disposed in each light-emitting area surrounded by the pixel-defining layer PDL. The light-emitting layer EML may be disposed on the exposed surface of the first pixel electrode PXE1. In an embodiment, the light-emitting layer EML may have a multi-layer thin-film structure including at least a light generation layer LGL. In one embodiment, for example, the light-emitting layer EML may include the light generation layer LGL for emitting light in a predetermined color, a first common layer HCL interposed between the light generation layer LGL and the first pixel electrode PXE1, and a second common layer ECL interposed between the light generation layer LGL and the second pixel electrode PXE2. In an embodiment, the first common layer HCL may include at least one of a hole injection layer and a hole transport layer. In an embodiment, the second common layer ECL may include at least one of a hole blocking layer, an electron transport layer, and an electron injection layer. In an embodiment, the light generation layer LGL may be individually patterned in accordance with the corresponding light-emitting area EMA. In an embodiment, the first common layer HCL and the second common layer ECL may be disposed to cover an entire surface of the display area DA.

In an embodiment, the second pixel electrode PXE2 may be disposed on the light-emitting layer EML. In an embodiment, the second pixel electrode PXE2 may be, but is not limited to, a cathode electrode of the light-emitting element EL. In an embodiment, the second pixel electrode PXE2 may be disposed to cover an entire surface of the display area DA, but the disclosure is not limited thereto.

In an embodiment, the first pixel electrodes PXE1 disposed in respective pixel areas PXA, the light-emitting layer EML disposed on the first pixel electrodes PXE1, and the second pixel electrode PXE2 disposed on the light-emitting layer EML may constitute or collectively define a light-emitting element layer ELL of the display device 10. In one embodiment, for example, the light-emitting element layer ELL may include a first pixel electrode layer including the first pixel electrodes PXE1 of the display pixels PXLd, light-emitting layers EML disposed on the first pixel electrodes PXE1, and a second pixel electrode layer including the second pixel electrode PXE2 disposed on the light-emitting layers EML.

A thin-film encapsulation layer TFE configured to encapsulate the second pixel electrode PXE2 may be disposed on the second pixel electrode PXE2. The thin-film encapsulation layer TFE may be disposed in a portion (e.g., at least the display area DA) of the display panel 110, in which the display pixels PXLd are disposed, and may encapsulate the display pixels PXLd. In an embodiment including the thin-film encapsulation layer TFE, the thickness of the display panel 110 may be reduced, and the flexibility of the display panel 110 may be secured while the display pixels PXLd are effectively protected.

In an embodiment, the thin-film encapsulation layer TFE may have a multi-layer structure or a single-layer structure. In one embodiment, for example, the thin-film encapsulation layer TFE may have a multi-layer structure including at least two overlapping inorganic layers and at least one organic layer interposed between the inorganic layers. Alternatively, the thin-film encapsulation layer TFE may have a single organic/inorganic hybrid insulating layer. In accordance with an embodiment, the thin-film encapsulation layer TFE may be replaced with an encapsulation substrate ENC including or made of a glass or a plastic material. In one embodiment, for example, the encapsulation substrate ENC may be disposed in the display area DA in a way such that at least the display pixels PXLd may be encapsulated. In accordance with an embodiment, the thin-film encapsulation layer TFE or the encapsulation substrate ENC for encapsulating the display pixels PXLd may form an encapsulation layer ENL of the display device 10.

In an embodiment, the backplane layer BPL, which includes the base layer BSL and selectively includes the circuit element layer (i.e., the circuit layer in which circuit elements constituting each pixel circuit PXC and various types of lines coupled to the circuit elements are disposed), the light-emitting element layer ELL, which includes light-emitting elements EL disposed in each pixel area PXA on the backplane layer BPL, and the encapsulation layer ENL, which is disposed on the display pixels PXLd including the light-emitting elements EL, may constitute the display panel 110. Accordingly, the display panel 110 may generate light corresponding to a data signal.

Figure 8:
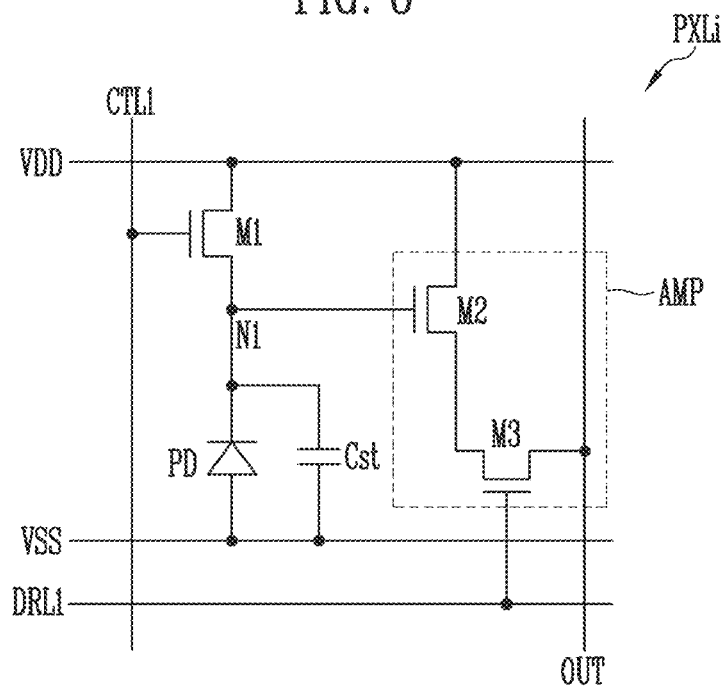
FIG. 8 is a circuit diagram illustrating a sensor pixel according to an embodiment of the disclosure.

FIG. 8 is a circuit diagram illustrating a sensor pixel PXLi according to an embodiment of the disclosure. Particularly, FIG. 8 shows a sensor pixel PXLi arranged in the sensing area SA of FIGS. 2 and 3. In an embodiment, sensor pixels PXLi arranged in the sensing area SA of FIGS. 2 and 3 may have substantially the same structure as each other, but the disclose is not limited thereto.

Referring to FIG. 8, an embodiment of the sensor pixel PXLi may include a light-sensing element PD. The light-sensing element PD may be an element for generating an electrical signal corresponding to a light receiving amount, and may be, for example, a photodiode. In accordance with an embodiment, the photodiode may be, but is not limited to, one of various types of photodiodes, such as a PIN diode and an avalanche photo detector ("APD") diode.

In an embodiment, the sensor pixel PXLi may further include a storage capacitor Cst which stores photocharges generated by the light-sensing element PD, a first transistor M1 which transfers a reset voltage to a first node N1 coupled to the storage capacitor Cst, and an amplifier AMP which includes a plurality of transistors for generating and amplifying a sending signal corresponding to the voltage of the first node N1.

The first transistor M1 may be coupled between a first power source VDD and the first node N1, and a gate electrode of the first transistor M1 may be coupled to a first control line CTL1. The first transistor M1 is turned on when a first control signal having a gate-on voltage (e.g., a high voltage) is supplied from the first control line CTL1, and then transfers the voltage of the first power source VDD to the first node N1. In an embodiment, the first power source VDD may be a high-potential operating power source of the image sensor 120.

The light-sensing element PD may be coupled between the first node N1 and a second power source VSS. In one embodiment, for example, the light-sensing element PD may be implemented as a photodiode coupled in a reverse direction between the first node N1 and the second power source VSS. The light-sensing element PD includes a light-receiving unit on which light can be incident and generates photocharges in response to the incident light. In an embodiment, the second power source VSS may be a low-potential or reference potential operating power source of the image sensor 120. In one embodiment, for example, the second power source VSS may have, but is not limited to, a ground level.

The storage capacitor Cst may be coupled in parallel to the light-sensing element PD between the first node N1 and the second power source VSS. The storage capacitor Cst stores the photocharges generated by the light-sensing element PD.

The amplifier AMP may include at least two transistors coupled in series between the first power source VDD and an output line OUT. The amplifier AMP outputs a sensing signal corresponding to the voltage of the first node N1 in response to a first driving signal supplied from a first driving line DRL1. The output line OUT may be a line, through which the sensing signal generated from each sensor pixel PXLi is output, and may be coupled to each RX channel configured in the sensor driver 220.

In an embodiment, the amplifier AMP may be a two-stage cascode amplifier including or defined by a second transistor M2 and a third transistor M3 coupled in series between the first power source VDD and the output line OUT. In an embodiment, each of the second and third transistors M2 and M3 may be, but is not limited to, a field-effect transistor.

The second transistor M2 may be coupled between the first power source VDD and the output line OUT, and a gate electrode of the second transistor M2 may be coupled to the first node N1. In such an embodiment, the second transistor M2 generates an electrical signal (hereinafter referred to as a "sensing signal") having a magnitude corresponding to the voltage of the first node N1.

The third transistor M3 may be coupled between the second transistor M2 and the output line OUT, and a gate electrode of the third transistor M3 may be coupled to the first driving line DRL1. The third transistor M3 is turned on when the first driving signal having a gate-on voltage is supplied from the first driving line DRL1, and then amplifies and outputs the sensing signal transferred from the second transistor M2.

Figure 9:
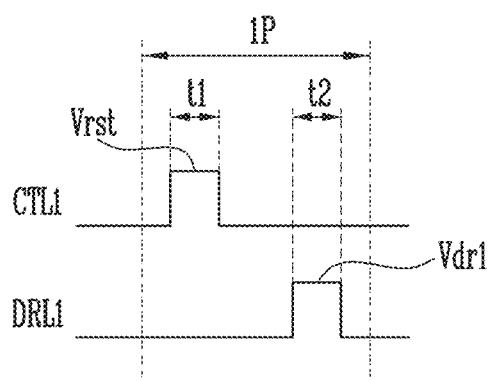
FIG. 9 is a signal timing diagram illustrating an embodiment of input signals for driving the sensor pixel of FIG. 8.

FIG. 9 is a signal timing diagram illustrating an embodiment of input signals for driving the sensor pixel PXLi of FIG. 8. For convenience of description, input signals that are supplied to the sensor pixel PXLi during one cycle (1P) of a sensing period in which the sensor pixel PXLi is activated are illustrated in FIG. 9, and the input signals may be repeatedly supplied to the sensor pixel PXLi during every cycle of the sensing period.

Referring to FIGS. 8 and 9, during each cycle (1P) of the sensing period in which the sensor pixel PXLi is activated, a first control signal Vrst and the first driving signal Vdr1, each having a gate-on voltage, may be sequentially supplied to the sensor pixel PXLi through the first control line CTL1 and the first driving line DRL1, respectively. In one embodiment, for example, the first control signal Vrst and the first driving signal Vdr1, each having a gate-on voltage, may be sequentially supplied to the sensor pixel PXLi at an interval of a predetermined time (i.e., with a time difference) during each cycle (1P).

In such an embodiment, as shown in FIG. 9, during a first interval t1, the first control signal Vrst having a gate-on voltage may be supplied through the first control line CTL1. Then, the first transistor M1 is turned on in response to the first control signal Vrst.

When the first transistor M1 is turned on, the voltage of the first power source VDD is transferred to the first node N1 while the voltage of the first node N1 is reset to the voltage of the first power source VDD. Accordingly, charges accumulated in the storage capacitor Cst during a previous cycle are reset.

Thereafter, the supply of the first control signal Vrst having a gate-on voltage is stopped, and the voltage of the first control line CTL1 is changed to a gate-off voltage. Accordingly, as the first transistor M1 is turned off, the first power source VDD is disconnected from the first node N1.

When light is incident on each light-sensing element PD during the first interval t1, the light-sensing element PD may generate photocharges corresponding to the incident light, and the generated photocharges are stored in the capacitor Cst. Accordingly, a voltage corresponding to the incident light is applied to the first node N1.

Thereafter, during a second interval t2, when the first driving signal Vdr1 (hereinafter also referred to as a "Tx signal", "readout signal" or "selection signal") having a gate-on voltage is supplied through the first driving line DRL1, the third transistor M3 is turned on. Then, a sensing signal generated in the second transistor T2 in response to the voltage of the first node N1 is output through the output line OUT via the third transistor M3. In such an embodiment, the second transistor M2 is turned on to a degree corresponding to the voltage of the first node N1, and then a sensing signal having a magnitude corresponding to the voltage of the first node N1 is generated. In such an embodiment, the third transistor M3 amplifies and outputs the sensing signal to a level corresponding to a gain value. The sensing signal output through each output line OUT may be input to the corresponding Rx channel of the sensor driver 220, and may be used to generate sensed information, such as a fingerprint.

In accordance with an embodiment of the sensor pixel PXLi and the image sensor 120 including the sensor pixel PXLi, as shown in FIGS. 8 and 9, charges accumulated in the storage capacitor Cst may be converted into a voltage signal depending on the light-receiving amount of each sensor pixel PXLi, and the voltage signal may be output. In such an embodiment, the sensing signal may be amplified within the sensor pixel PXLi depending on the gain of the amplifier AMP in each sensor pixel PXLi, and the amplified sensing signal is output. Accordingly, the influence of noise may be reduced, and signal-to-noise ratio ("SNR") may be effectively improved. Therefore, in accordance with embodiments of the invention, when the image sensor 120 is implemented as a high-resolution image senor and/or as a large-sized image sensor, high sensitivity features may be secured.

In a case where the image sensor 120 is implemented as a high-resolution image sensor and/or a large-sized image sensor, the sizes of the light-sensing element PD and the storage capacitor Cst of each sensor pixel PXLi may be reduced, such that the distance between the sensor pixel PXLi and the RX channel coupled thereto is increased, thus increasing the capacitance of a parasitic capacitor. Accordingly, SNR of each sensing signal may be decreased, and thus the image sensor is vulnerable to noise. In embodiments of the disclosure, SNR may be improved when the sensing signal is amplified within each sensor pixel PXLi and is then output while photocharges corresponding to incident light are converted into a voltage-type sensing signal and the voltage-type sensing signal is output. Accordingly, the high-sensitivity image sensor 120 and the display device 10 having the image sensor 120 may be provided.

Figure 10:
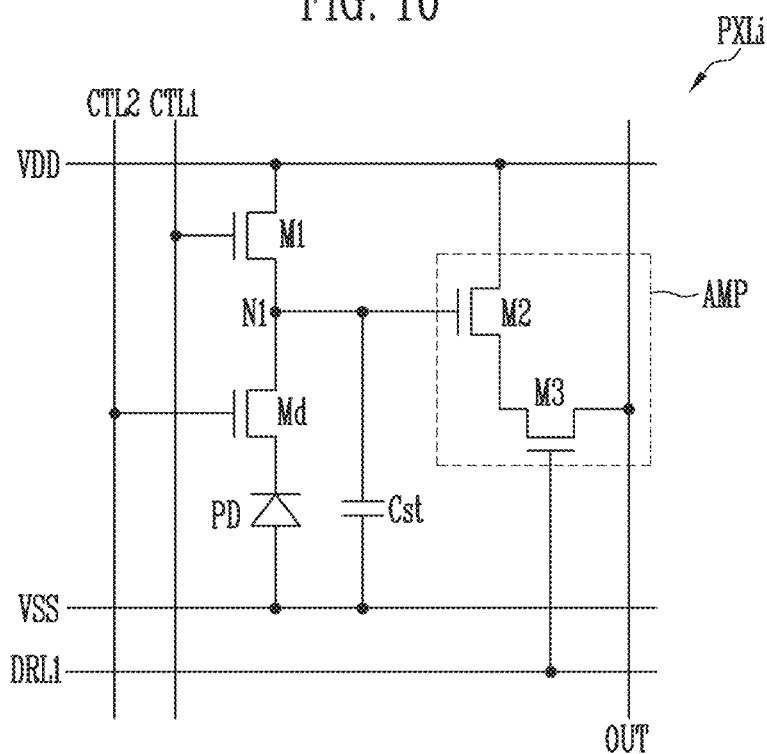
FIG. 10 is a circuit diagram illustrating a sensor pixel according to an alternative embodiment of the disclosure.

FIG. 10 is a circuit diagram illustrating a sensor pixel PXLi according to an embodiment of the disclosure. In the embodiment of FIG. 10, the same reference numerals are used to designate components similar or identical to those in the embodiment of FIG. 8, and any repetitive detailed description thereof will be omitted.

Referring to FIG. 10, an embodiment of a sensor pixel PXLi may further include a transfer transistor Md (hereinafter also referred to as a "sixth transistor"). In such an embodiment, an image sensor 120 including the sensor pixel PXLi may further include a second control line CTL2 coupled to the transfer transistor Md of the sensor pixel PXLi.

The transfer transistor Md may be coupled between a first node N1 and a light-sensing element PD, and a gate electrode of the transfer transistor Md may be coupled to the second control line CTL2. In such an embodiment, the transfer transistor Md is turned on when a second control signal having a gate-on voltage is supplied from the second control line CTL2. When the transfer transistor Md is turned on, photocharges accumulated in the light-sensing element PD are transferred to the first node N1.

Figure 11:
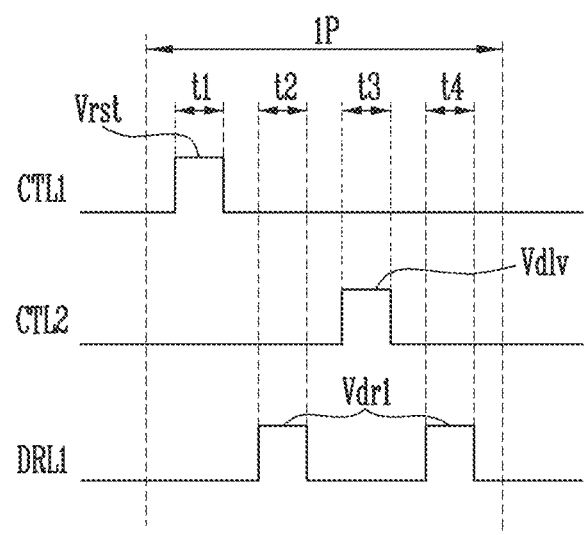
FIG. 11 is a signal timing diagram illustrating another alternative embodiment of input signals for driving the sensor pixel of FIG. 10.

FIG. 11 is a signal timing diagram illustrating embodiments of input signals for driving the sensor pixel PXLi of FIG. 10. In the embodiment of FIGS. 10 and 11, any repetitive detailed description of components similar or identical to those of the embodiment of FIGS. 8 and 9 will be omitted.

Referring to FIGS. 10 and 11, during each cycle (1P) of a sensing period in which the sensor pixel PXLi is activated, a first control signal Vrst and a second control signal Vdlv, each having a gate-on voltage, may be sequentially supplied to the sensor pixel PXLi through a first control line CTL1 and the second control line CTL2, respectively. In one embodiment, for example, the first control signal Vrst and the second control signal Vdlv, each having a gate-on voltage, may be sequentially supplied to the sensor pixel PXLi at an interval of a predetermined time (i.e., with a time difference) during each cycle (1P). In an embodiment, a first driving signal Vdr1 having a gate-on voltage may be individually supplied subsequent to the first and second control signals Vrst and Vdlv a plurality of times during each cycle (1P) of the sensing period. In one embodiment, for example, during each cycle 1P of the sensing period, the first control signal Vrst, a primary first driving signal Vdr1, the second control signal Vdlv, and a secondary first driving signal Vdr1 may be sequentially supplied.

In such an embodiment, during a first interval t1, when the first control signal Vrst having a gate-on voltage is supplied through the first control line CTL1, the first transistor M1 is turned on. Accordingly, as the voltage of the first power source VDD is transferred to the first node N1, the voltage of the first node N1 is reset.

Thereafter, during a second interval t2, when the primary first driving signal Vdr1 having a gate-on voltage is supplied, the third transistor M3 is turned on. Accordingly, a first sensing signal (hereinafter also referred to as an "initial sensing signal") corresponding to the voltage of the first node N1 is output through the output line OUT.

Thereafter, during a third interval t3, when the second control signal Vdlv having a gate-on voltage is supplied through the second control line CTL2, the transfer transistor Md is turned on. Accordingly, photocharges generated by the light-sensing element PD are transferred to the first node N1.

Thereafter, during a fourth interval t4, when the secondary first driving signal Vdr1 having a gate-on voltage is supplied, the third transistor M3 is turned on. Accordingly, a second sensing signal (hereinafter also referred to as a "light-sensing signal") corresponding to the voltage of the first node N1 is output through the output line OUT.

Then, the sensor driver 220 may detect the difference between the first sensing signal and the second sensing signal that are sequentially input through respective Rx channels and may detect a change between the sensing signals depending on the incident light based on the difference.

In an embodiment, as shown in FIGS. 10 and 11, the sensor pixel PXLi and the image sensor 120 including the sensor pixel PXLi may convert charges accumulated in the storage capacitor Cst into a voltage signal and output the voltage signal, and may amplify and output the sensing signal generated within the sensor pixel PXLi. Accordingly, the influence of noise may be reduced, and SNR may be effectively improved.

In such an embodiment, the sensor pixel PXLi and the image sensor 120 including the sensor pixel PXLi may output the voltage of the first node N1 that has been generated depending on a reset and the voltage of the first node N1 that has changed depending on the transfer of photocharges accumulated in the light-sensing element PD due to incident light in a time division manner. Then, the sensor driver 220 may detect the change between sensing signals depending on incident light based on the differences between the first and second sensing signals that are output from respective sensor pixels PXLi. Accordingly, sensing signals depending on the quantities of light incident on respective sensor pixels PXLi may be more accurately detected.

Figure 12:
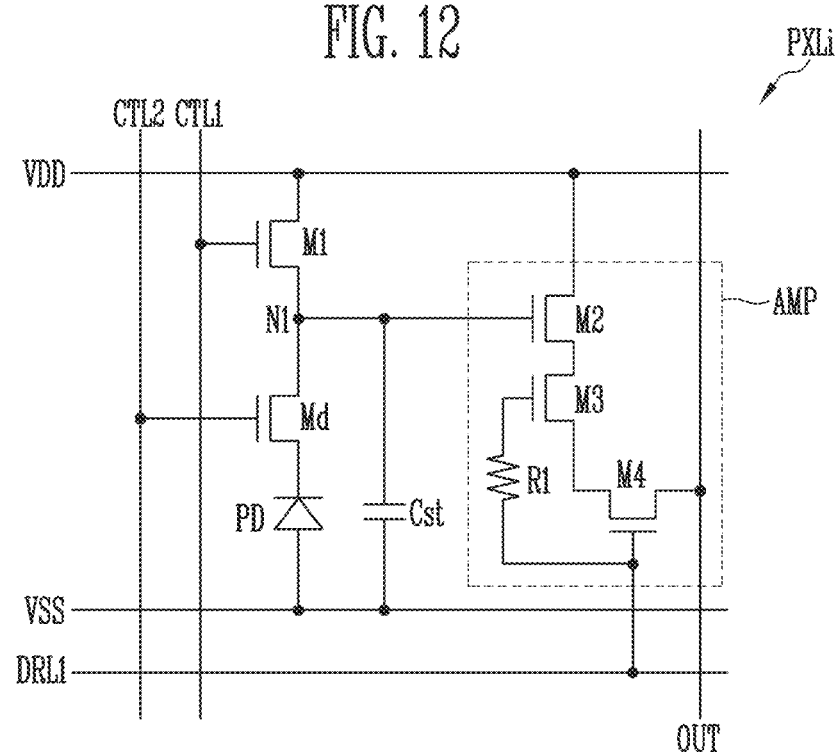
FIG. 12 is a circuit diagram illustrating a sensor pixel according to another alternative embodiment of the disclosure.

FIG. 12 is a circuit diagram illustrating a sensor pixel PXLi according to another alternative embodiment of the disclosure. In the embodiment of FIG. 12, the same reference numerals are used to designate components similar or identical to those in the above-described embodiments (e.g., the embodiment of FIG. 10), and a detailed description of the components will be omitted.

Referring to FIG. 12, an embodiment of a sensor pixel PXLi may include a multistage amplifier AMP including three or more transistors coupled in series between a first power source VDD and an output line OUT. In one embodiment, for example, the amplifier AMP may be implemented as a three-stage cascode amplifier.

In an embodiment, the amplifier AMP may include a second transistor M2 which generates a sensing signal corresponding to the voltage of a first node N1 and a third transistor M3 and a fourth transistor M4 which amplify and output sensing signals transferred from the second transistor M2 (e.g., first and second sensing signals). In one embodiment, for example, the third and fourth transistors M3 and M4 may amplify and output the sensing signals transferred from the second transistor M2 during an interval in which a first driving signal Vdr1 having a gate-on voltage is supplied from a first driving line DRL1.

In accordance with an embodiment, gate electrodes of the third and fourth transistors M3 and M4 may be coupled in common to the first driving line DRL1. Accordingly, the first driving signal Vdr1 supplied from the first driving line DRL1 may be transferred both to the third and fourth transistors M3 and M4.

In such an embodiment, the magnitudes (e.g., voltages) of the first driving signal Vdr1 transferred to the gate electrodes of the third and fourth transistors M3 and M4 may be different from each other. In one embodiment, for example, each sensor pixel PXLi may further include a first resistor element R1 coupled between the gate electrode of the third transistor M3 and the first driving line DRL1. Accordingly, the first driving signal Vdr1 transferred to the gate electrode of the third transistor M3 may have a magnitude lower than that of the first driving signal Vdr1 transferred to the gate electrode of the fourth transistor M4.

The third and fourth transistors M3 and M4 may sequentially amplify and output the sensing signal transferred from the second transistor M2 during an interval in which the first driving signal Vdr1 having a gate-on voltage is supplied from the first driving line DRL1. In an embodiment, the sensing signal from the second transistor M2 may be amplified twice while sequentially passing through the third and fourth transistors M3 and M4. Accordingly, In such an embodiment, the sensing signal may be more effectively amplified. Therefore, in accordance with the above-described embodiment, SNR of the sensing signal output from each sensor pixel PXLi may be more effectively improved, and the sensitivity of the image sensor 120 may be improved.

In an embodiment of FIG. 12, the sensor pixel PXLi may include the transfer transistor Md, similarly to the embodiment of FIG. 10, but the transfer transistor Md may be selectively omitted. In the embodiment of FIG. 12 and other embodiments which will be described later, the sensor pixel PXLi may or may not include the transfer transistor MD.

Figure 13:
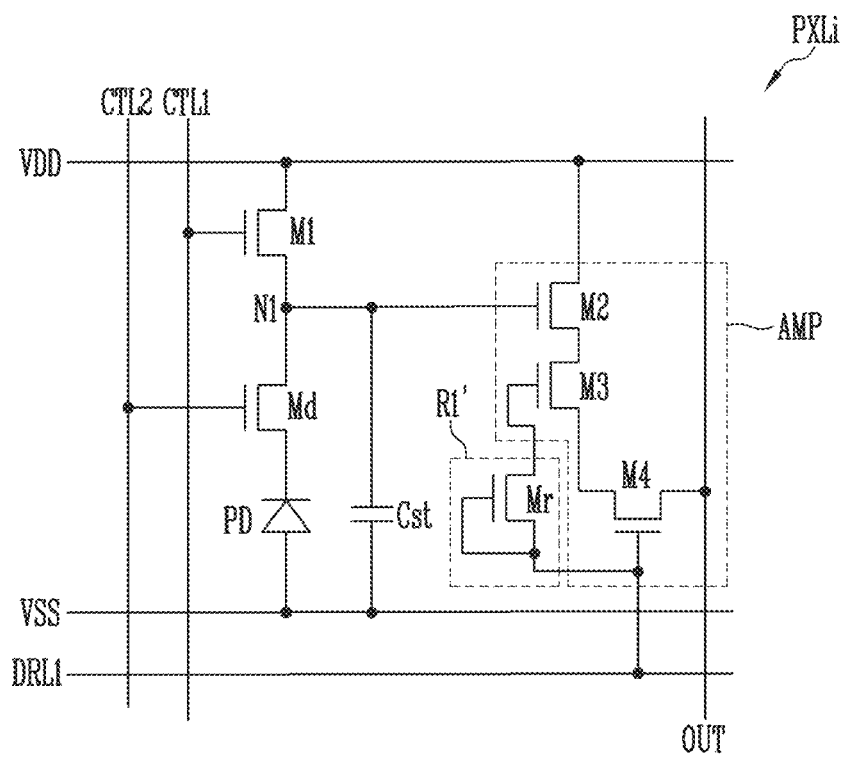
FIG. 13 is a circuit diagram illustrating a sensor pixel according to an embodiment of the disclosure.

FIG. 13 is a circuit diagram illustrating a sensor pixel PXLi according to another alternative embodiment of the disclosure. In the embodiment of FIG. 13, the same reference numerals are used to designate components similar or identical to those in the above-described embodiments (e.g., the embodiment of FIG. 12), and any repetitive detailed description of thereof will be omitted.

Referring to FIG. 13, a first resistor element R1' may include a transistor element Mr coupled in the form of a diode between a first driving line DRL1 and a gate electrode of a third transistor M3. In one embodiment, for example, the first resistor element R1' may be implemented as the transistor element Mr alone or may further include an additional resistor element in addition to the transistor element Mr.

The transistor element Mr may decrease the voltage of a first driving signal Vdr1 supplied from the first driving line DRL1 by a threshold voltage, and may transfer the decreased voltage to the gate electrode of the third transistor M3. Accordingly, as described above with reference to FIG. 12, a sensing signal generated from the second transistor M2 may be amplified twice while sequentially passing through the third and fourth transistors M3 and M4 during an interval in which the first driving signal Vdr1 having a gate-on voltage is supplied from the first driving line DRL1.

Figure 14:
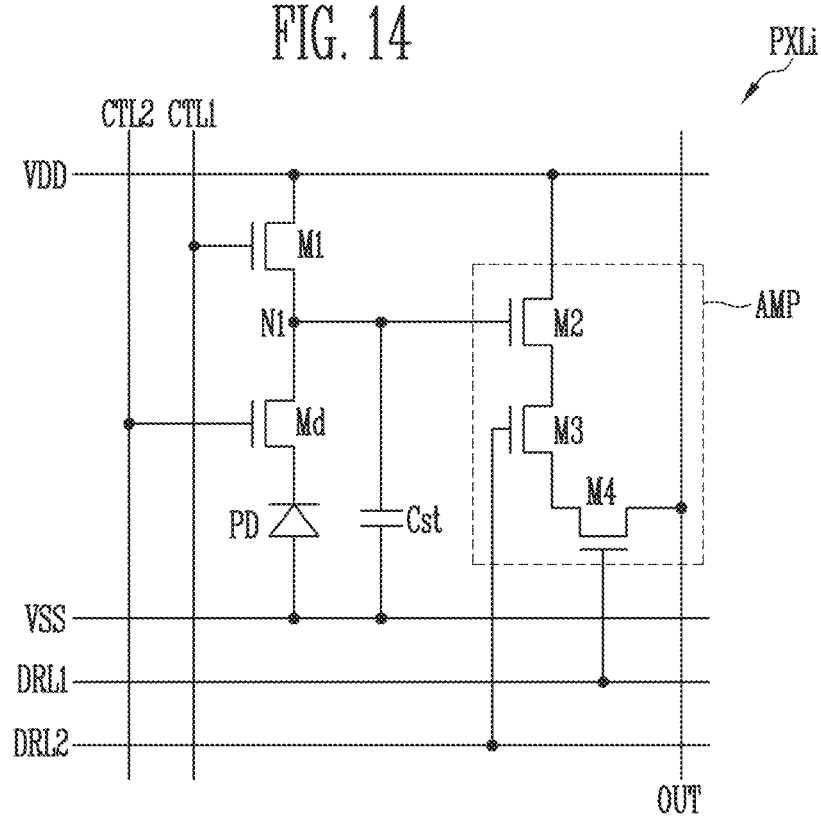
FIG. 14 is a circuit diagram illustrating a sensor pixel according to another alternative embodiment of the disclosure.
Figure 15:
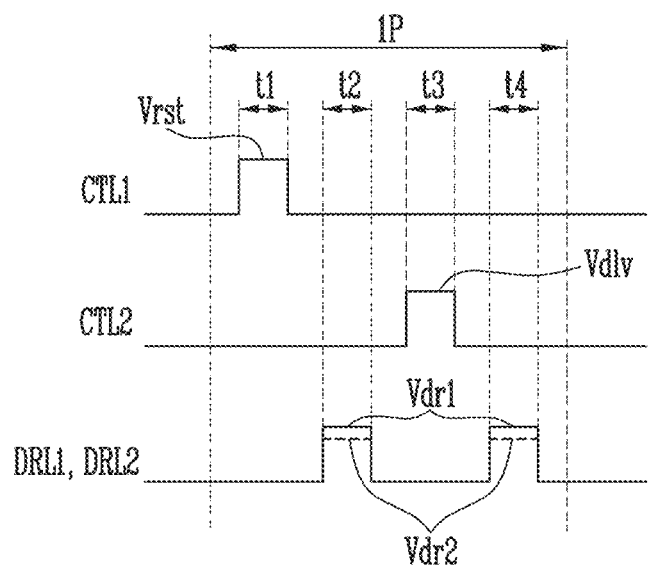
FIG. 15 is a signal timing diagram illustrating an embodiment of input signals for driving the sensor pixel of FIG. 14.

FIG. 14 is a circuit diagram illustrating a sensor pixel PXLi according to another alternative embodiment of the disclosure. FIG. 15 is a signal timing diagram illustrating an embodiment of input signals for driving the sensor pixel PXLi of FIG. 14. In the embodiments of FIGS. 14 and 15, the same reference numerals are used to designate components similar or identical to those in the above-described embodiments, and thus any repetitive detailed description thereof will be omitted.

Referring to FIGS. 14 and 15, in an embodiment of the sensor pixel PXLi, a third transistor M3 and a fourth transistor M4 may be coupled to different driving lines, respectively. In one embodiment, for example, a gate electrode of the fourth transistor M4 may be coupled to a first driving line DRL1 through which a first driving signal Vdr1 is supplied, and a gate electrode of the third transistor M3 may be coupled to a second driving line DRL2 through which a second driving signal Vdr2 is supplied. In such an embodiment, the image sensor 120 may be coupled to each sensor pixel PXLi, and may include first and second driving lines DLR1 and DRL2 that are separate or disconnected from each other.

In an embodiment, the first and second driving signals Vdr1 and Vdr2 may be supplied to temporally overlap each other. Here, the supply of the first and second driving signals Vdr1 and Vdr2 to temporally overlap each other may mean that times during which the first and second driving signals Vdr1 and Vdr2 are supplied overlap each other. In one embodiment, for example, the first and second driving signals Vdr1 and Vdr2 may be simultaneously supplied. However, the disclosure is not limited thereto. In an alternative embodiment, the first and second driving signals Vdr1 and Vdr2 may be supplied to merely partially overlap each other.

In an embodiment, the first and second driving signals Vdr1 and Vdr2 may have different magnitudes from each other. In one embodiment, for example, the second driving signal Vdr2 may have a gate-on voltage (e.g., a gate-on voltage lower than that of the first driving signal Vdr1). Accordingly, during the intervals in which first and second driving signals Vdr1 and Vdr2, each having a gate-on voltage, are supplied from the first and second driving lines DRL1 and DRL2, the sensing signal generated from the second transistor M2 may be amplified twice, and the amplified signal may be output.

Figure 16:
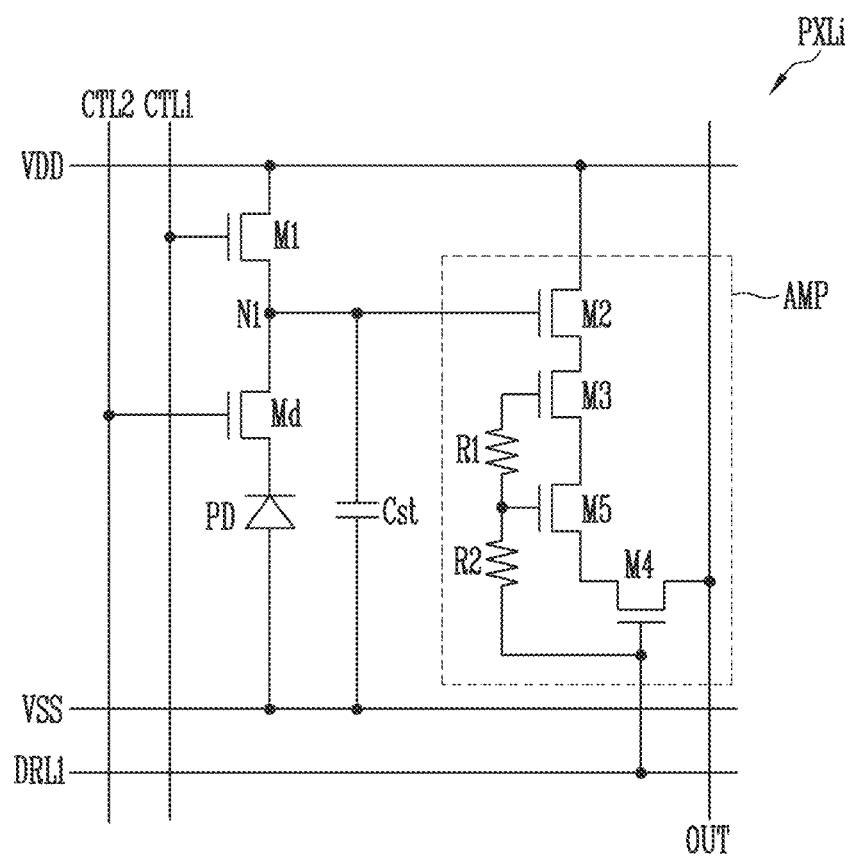
FIG. 16 is a circuit diagram illustrating a sensor pixel according to another alternative embodiment of the disclosure.

FIG. 16 is a circuit diagram illustrating a sensor pixel PXLi according to another alternative embodiment of the disclosure. In the embodiment of FIG. 16, the same reference numerals are used to designate components similar or identical to those in the above-described embodiments (e.g., the embodiment of FIG. 12), and any repetitive detailed description thereof will be omitted.

Referring to FIG. 16, an amplifier AMP may be implemented as a four-stage cascode amplifier which further includes a fifth transistor M5 and a second resistor element R2, in addition to the elements of the amplifier described above with reference to FIG. 12. In one embodiment, for example, the amplifier AMP may further include the fifth transistor M5 coupled between a third transistor M3 and a fourth transistor M4 and the second resistor element R2 coupled to a gate electrode of the fifth transistor M5. Alternatively, the amplifier AMP may also be implemented as a five or more-stage cascode amplifier by adding at least one transistor and at least one resistor element.

The fifth transistor M5 may be coupled between the third transistor M3 and the fourth transistor M4. The gate electrode of the fifth transistor M5 may be coupled between a first resistor element R1 and the second resistor element R2.

The second resistor element R2 may be coupled between the first resistor element R1 and the first driving line DRL1. Accordingly, the third transistor M3, the fifth transistor M5, and the fourth transistor M4 may be supplied with a gate-on voltage (i.e., a first driving signal Vdr1), the magnitude of which is gradually increased in the sequence of M3, M5, and M4.

In such an embodiment, a sensing signal from the second transistor M2 may be amplified three times while sequentially passing through the third transistor M3, the fifth transistor M5, and the fourth transistor M4. Accordingly, the sensing signal may be more effectively amplified, and thus SNR may be improved.

Figure 17:
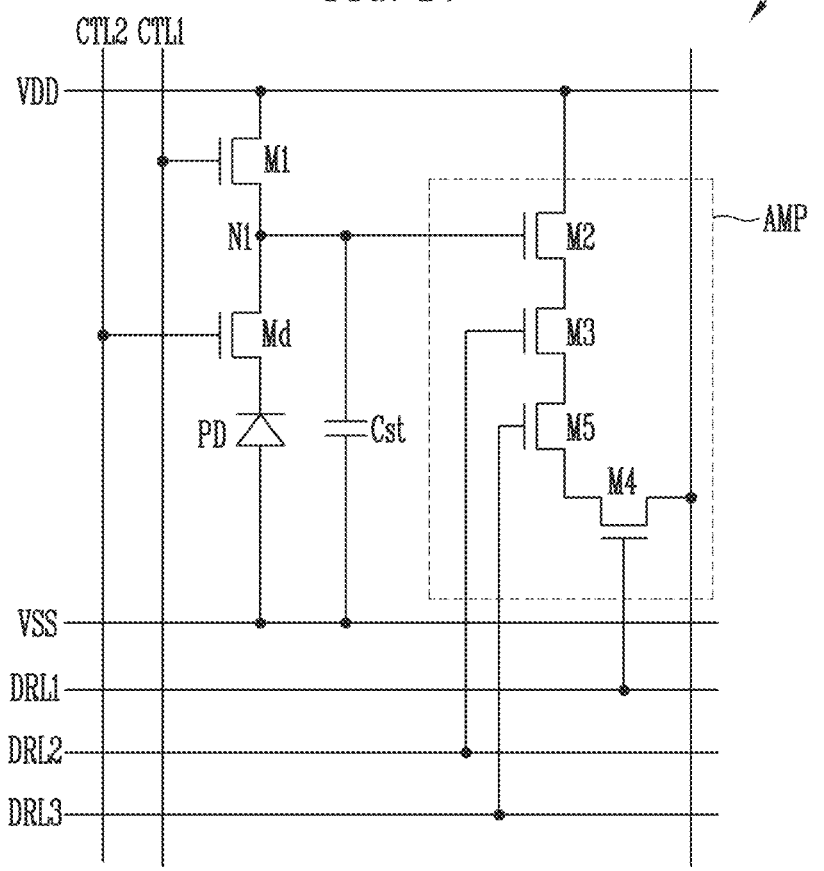
FIG. 17 is a circuit diagram illustrating a sensor pixel according to another embodiment of the disclosure.
Figure 18:
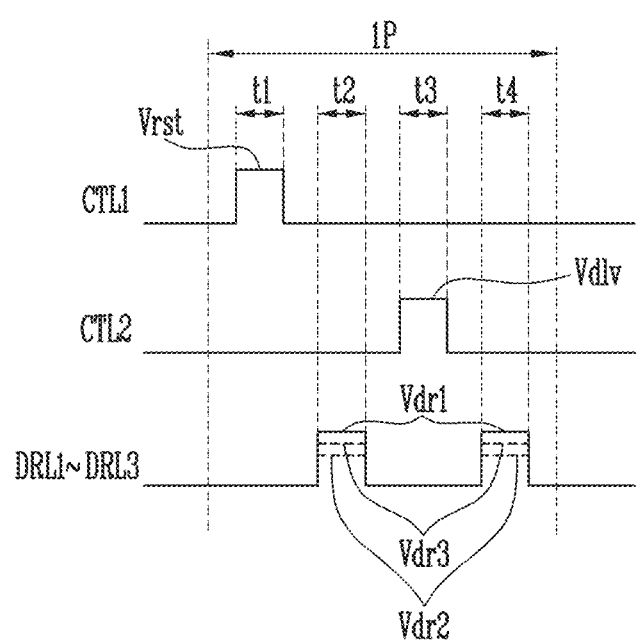
FIG. 18 is a signal timing diagram illustrating an embodiment of input signals for driving the sensor pixel of FIG. 17.

FIG. 17 is a circuit diagram illustrating a sensor pixel PXLi according to another alternative embodiment of the disclosure. FIG. 18 is a signal timing diagram illustrating an embodiment of input signals for driving the sensor pixel PXLi of FIG. 17. In the embodiments of FIGS. 17 and 18, the same reference numerals are used to designate components similar or identical to those in the above-described embodiments, and thus any repetitive detailed description thereof will be omitted.

Referring to FIGS. 17 and 18, in an embodiment of the sensor pixel PXLi, the third to fifth transistors M3, M4, and M5 may be coupled to different driving lines from each other. In one embodiment, for example, a gate electrode of the third transistor M3 may be coupled to the second driving line DRL2 through which the second driving signal Vdr2 is supplied, and a gate electrode of the fifth transistor M5 may be coupled to a third driving line DRL3 through which the third driving signal Vdr3 having a gate-on voltage higher than that of the second driving signal Vdr2 is supplied. A gate electrode of the fourth transistor M4 may be coupled to a first driving line DRL1 through which a first driving signal Vdr1 having a gate-on voltage higher than those of the second and third driving signals Vdr2 and Vdr3 is supplied. In this case, the image sensor 120 may be coupled to each sensor pixel PXLi, and may include first, second, and third driving lines DRL1, DRL2, and DRL3 that are separate from each other. Alternatively, the amplifier AMP may be implemented as a five or more-stage cascode amplifier by adding at least one transistor and forming a plurality of driving lines for separately controlling individual transistors.

In an embodiment, the first, second, and third driving signals Vdr1, Vdr2, and Vdr3 may be supplied in a way such that times, during which the driving signals are supplied, temporally overlap each other. In one embodiment, for example, the first, second, and third driving signals Vdr1, Vdr2, and Vdr3 may be simultaneously supplied. However, the configuration of the disclosure is not limited thereto. In an alternative embodiment, the first, second, and third driving signals Vdr1, Vdr2, and Vdr3 may be supplied such that they only partially overlap each other.

In one embodiment, for example, the first, second, and third driving signals Vdr1, Vdr2, and Vdr3 may have different magnitudes from each other. In one embodiment, for example, the third driving signal Vdr3 may have a gate-on voltage having a magnitude greater than that of the second driving signal Vdr2 (e.g., a gate-on voltage higher than that of the second driving signal Vdr2) and may have a gate-on voltage having a magnitude less than that of the first driving signal Vdr1 (e.g., a gate-on voltage lower than that of the first driving signal Vdr1). Accordingly, during intervals in which the first, second, and third driving signals Vdr1, Vdr2, and Vdr3 are supplied, the sensing signal generated from the second transistor M2 may be effectively amplified and output.

Alternative, the embodiments of FIGS. 16 and 17 may be applied in combination in such a way that two of the third to fifth transistors M3, M4, and M5 are coupled to the same driving line and in such a way that at least one resistor element is coupled between the gate electrodes of the two transistors and the remaining transistor is coupled to a driving line different from that of the two transistors. In such embodiments, sensor pixels PXLi may operate with reduced noise and improved sensitivity. The embodiments set forth herein may be applied alone or, alternatively, at least two of the embodiments may be applied in combination.

In accordance with embodiments of the disclosure, each of the sensor pixels PXLi constituting the image sensor 120 may convert charges accumulated in response to incident light into the form of a voltage signal and then output a sensing signal. In such embodiments, each of the sensor pixels PXLi may amplify the sensing signal using the amplifier AMP provided therein and may output the amplified sensing signal through the corresponding output line OUT. Accordingly, the influence of noise may be reduced, and SNR may be effectively improved. In an embodiment, where a sensor pixel PXLi including a multistage amplifier AMP, such as a three or more-stage cascode structure, sensing signals may be more effectively amplified and output. Therefore, in a case where the image sensor 120 is implemented as a high-resolution image sensor and/or a large-sized image sensor, sufficient sensitivity may be secured.

Further, in accordance with an embodiment, either before each sensing period or periodically, the first node N1 is in a fully-depletion state, after which photocharges accumulated in the light-sensing element PD may be transferred to the first node N1. Furthermore, in accordance with an embodiment, a correlated double sampling ("CDS") scheme may be applied to the output end of the image sensor 120, and thus noise may be removed. Accordingly, sensing signals depending on the quantities of light incident on respective sensor pixels PXLi may be more precisely detected.

Although all transistors constituting each sensor pixel PXLi are illustrated as being N-type transistors, the disclosure is not limited thereto. In an alternative embodiment, at least one of transistors constituting each sensor pixel PXLi may be changed to a P-type transistor. In such an embodiment, a control signal and/or a driving signal for controlling the P-type transistor may have a gate-on voltage (e.g., a low voltage) at a voltage level differently from the above-described embodiments.

In accordance with embodiments of the image sensor and the display device including the image sensor according to the disclosure, each of the sensor pixels constituting the image sensor includes an amplifier for amplifying and outputting a sensing signal corresponding to incident light. Accordingly, the influence of noise may be reduced, and SNR may be effectively improved. In accordance with embodiments of the disclosure, when an image sensor is implemented as a high-resolution image senor or as a large-sized image sensor, a high sensitivity image sensor may be provided.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. An image sensor comprising:
a sensor pixel including:
a first transistor coupled between a first power source and a first node, wherein the first transistor is turned on in response to a first control signal;
a light-sensing element coupled between the first node and a second power source, wherein the light-sensing element generates photocharges in response to incident light;
a storage capacitor coupled in parallel to the light-sensing element between the first node and the second power source; and
an amplifier coupled between the first power source and an output line, wherein the amplifier outputs a sensing signal corresponding to a voltage of the first node in response to a first driving signal,
wherein the amplifier comprises:
a second transistor coupled between the first power source and the output line, wherein the second transistor includes a gate electrode coupled to the first node and generates the sensing signal;
a third transistor coupled between the second transistor and the output line, wherein the third transistor amplifies and outputs the sensing signal during an interval in which the first driving signal is supplied; and
a fourth transistor coupled between the third transistor and the output line, and
wherein the fourth transistor amplifies and outputs a sensing signal supplied from the third transistor during the interval in which the first driving signal is supplied.

2. The image sensor according to claim 1, further comprising:
a first driving line coupled in common to gate electrodes of the third and fourth transistors, wherein the first driving line transmits the first driving signal therethrough; and
a first resistor element coupled between the gate electrode of the third transistor and the first driving line.

3. The image sensor according to claim 2, wherein the first resistor element comprises a transistor element coupled in a form of a diode between the first driving line and the gate electrode of the third transistor.

4. The image sensor according to claim 2, wherein the amplifier further comprises:
a second resistor element coupled between the first resistor element and the first driving line; and
a fifth transistor coupled between the third transistor and the fourth transistor, wherein the fifth transistor includes a gate electrode coupled between the first and second resistor elements.

5. The image sensor according to claim 1, further comprising:
a first driving line coupled to the gate electrode of the fourth transistor, wherein the first driving line transmits the first driving signal therethrough; and
a second driving line coupled to the gate electrode of the third transistor, wherein the second driving line transmits a second driving signal therethrough during the interval in which the first driving signal is supplied.

6. The image sensor according to claim 5, wherein the second driving signal has a gate-on voltage lower than a voltage level of the first driving signal.

7. The image sensor according to claim 5, further comprising:
a fifth transistor coupled between the third transistor and the fourth transistor, and
a third driving line coupled to a gate electrode of the fifth transistor, wherein the third driving line transmits a third driving signal, which overlaps the first and second driving signals, therethrough.

8. The image sensor according to claim 7, wherein the third driving signal has a gate-on voltage, which is higher than a voltage level of the second driving signal, and is lower than a voltage level of the first driving signal.

9. A display device comprising:
a display panel including a display pixel; and
an image sensor including a sensor pixel,
wherein the sensor pixel comprises:
a first transistor coupled between a first power source and a first node, wherein the first transistor is turned on in response to a first control signal;

a light-sensing element coupled between the first node and a second power source, wherein the light-sensing element generates photocharges in response to incident light;

a storage capacitor coupled in parallel to the light-sensing element between the first node and the second power source; and an amplifier coupled between the first power source and an output line, wherein the amplifier outputs a sensing signal corresponding to a voltage of the first node in response to a first driving signal, wherein the amplifier comprises:

a second transistor coupled between the first power source and the output line, wherein the second transistor includes a gate electrode coupled to the first node to generate the sensing signal;

a third transistor coupled between the second transistor and the output line, wherein the third transistor amplifies and outputs the sensing signal during an interval in which the first driving signal is supplied; and a fourth transistor coupled between the third transistor and the output line, and wherein the fourth transistor amplifies and outputs a sensing signal supplied from the third transistor during the interval in which the first driving signal is supplied.

* * * * *